United States Patent
Jung et al.

(10) Patent No.: US 9,196,814 B2
(45) Date of Patent: *Nov. 24, 2015

(54) LIGHT EMITTING DEVICE PACKAGE AND LIGHT UNIT

(71) Applicant: LG Innotek Co., Ltd., Seoul (KR)

(72) Inventors: Su Jung Jung, Seoul (KR); Yon Tae Moon, Seoul (KR); Young Jun Cho, Seoul (KR); Son Kyo Hwang, Seoul (KR); Byung Mok Kim, Seoul (KR); Seo Yeon Kwon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/253,606

(22) Filed: Apr. 15, 2014

(65) Prior Publication Data

US 2014/0225151 A1    Aug. 14, 2014

Related U.S. Application Data

(63) Continuation of application No. 13/591,626, filed on Aug. 22, 2012, now Pat. No. 8,704,433.

(30) Foreign Application Priority Data

| Aug. 22, 2011 | (KR) | 10-2011-0083721 |
|---|---|---|
| Aug. 24, 2011 | (KR) | 10-2011-0084718 |
| Dec. 9, 2011 | (KR) | 10-2011-0131466 |
| Dec. 22, 2011 | (KR) | 10-2011-0139806 |
| Dec. 22, 2011 | (KR) | 10-2011-0140236 |
| Dec. 27, 2011 | (KR) | 10-2011-0143151 |
| Dec. 27, 2011 | (KR) | 10-2011-0143152 |
| Dec. 30, 2011 | (KR) | 10-2011-0147361 |

(51) Int. Cl.
*H01L 33/64* (2010.01)
*C09K 11/67* (2006.01)
(Continued)

(52) U.S. Cl.
CPC ........... *H01L 33/64* (2013.01); *C09K 11/67* (2013.01); *H01L 33/641* (2013.01); *H01S 5/02469* (2013.01); *H01L 25/0753* (2013.01); *H01L 33/62* (2013.01); *H01L 2224/32013* (2013.01); *H01L 2224/45144* (2013.01);
(Continued)

(58) Field of Classification Search
CPC ....... H01L 33/641; H01L 33/64; H01L 33/62; H01L 25/0753; H01L 2224/48091; H01L 2224/73265; H01L 2224/32013; H01L 2224/45144; H01L 2924/01322; H01L 2924/12032; C09K 11/67; H01S 5/02469
See application file for complete search history.

(56) References Cited

U.S. PATENT DOCUMENTS

| 6,517,218 B2 | 2/2003 | Hochstein |
| 2008/0068842 A1 | 3/2008 | Dekker et al. |

(Continued)

OTHER PUBLICATIONS

U.S. Office Action for U.S. Appl. No. 13/591,626 dated Aug. 20, 2013.

*Primary Examiner* — Mary Ellen Bowman
(74) *Attorney, Agent, or Firm* — KED & Associates LLP

(57) ABSTRACT

Embodiments provide a light emitting device package including a package body having a through-hole; a radiator disposed in the through-hole and including an alloy layer having Cu; and a light emitting device disposed on the radiator, wherein the alloy layer includes at least one of W or Mo, and wherein the package body includes cavity including a sidewall and a bottom surface, and wherein the through-hole is formed in the bottom surface.

20 Claims, 34 Drawing Sheets

(51) Int. Cl.
*H01S 5/024* (2006.01)
*H01L 25/075* (2006.01)
*H01L 33/62* (2010.01)

(52) U.S. Cl.
CPC ............... *H01L 2224/48091* (2013.01); *H01L 2224/73265* (2013.01); *H01L 2924/01322* (2013.01); *H01L 2924/12032* (2013.01)

(56) References Cited

U.S. PATENT DOCUMENTS

| | | |
|---|---|---|
| 2008/0101071 A1 | 5/2008 | Imai et al. |
| 2009/0190371 A1 | 7/2009 | Root et al. |
| 2009/0301765 A1 | 12/2009 | Strauss et al. |
| 2010/0177519 A1 | 7/2010 | Schlitz |
| 2010/0207500 A1 | 8/2010 | Pabst et al. |
| 2013/0049565 A1 | 2/2013 | Jung et al. |

LIGHT EMITTING DEVICE PACKAGE AND LIGHT UNIT

CROSS REFERENCE TO RELATED APPLICATION

This application is a Continuation application of U.S. patent application Ser. No. 13/591,626, filed Aug. 22, 2012, which claims priority under 35 U.S.C. §119 to Korean Patent Application No. 10-2011-0083721, filed on Aug. 22, 2011, Korean Patent Application No. 10-2011-0084718, filed on Aug. 24, 2011, Korean Patent Application No. 10-2011-0131466, filed on Dec. 09, 2011, Korean Patent Application No. 10-2011-0139806, filed on Dec. 22, 2011, Korean Patent Application No. 10-2011-0140236, filed on Dec. 22, 2011, Korean Patent Application No. 10-2011-0143151, filed on Dec. 27, 2011, Korean Patent Application No. 10-2011-0143152, filed on Dec. 27, 2011, and Korean Patent Application No. 10-2011-0147361, filed on Dec. 30, 2011, which are hereby incorporated in their entirety by reference as if fully set forth herein.

TECHNICAL FIELD

Embodiments relate to a light emitting device package, a light source module, and a light unit.

BACKGROUND

Light emitting devices, such as laser diodes or light emitting diodes that use group III-V or group II-VI compound semiconductors, are capable of emitting light of various colors, such as for example, red, green, blue, and ultraviolet light, owing to developments of device materials and thin-film growth technologies. Moreover, these light emitting devices are capable of emitting white light with high efficiency through use of a fluorescent substance or color combination, and have advantages including low power consumption, semi-permanent lifespan, fast response time, safety and environmental friendliness as compared to conventional light sources, such as fluorescent lamps, incandescent lamps and the like.

Accordingly, application sectors of light emitting devices are expanded up to transmitting modules of optical communication means, light emitting diode backlights that can replace Cold Cathode Fluorescence Lamps (CCFLs) constituting backlights of Liquid Crystal Display (LCD) apparatuses, white light emitting diode lighting apparatuses that can replace fluorescent lamps or incandescent lamps, automobile head lights, and traffic lights.

A light emitting device package is configured such that a first electrode and a second electrode are arranged on a package body, and a light emitting device is placed on a bottom surface of the package body and is electrically connected to the first electrode and the second electrode.

In the case of a light emitting device package in which a light emitting diode to emit ultraviolet light (UV) is mounted, if reflected ultraviolet light reaches a package body, an organic material contained in the package body is discolored or deteriorated, causing reduction in the reliability of the package. Thus, there exists a need to improve the reliability of the light emitting device package while maintaining excellent heat radiation properties.

FIG. 1 is a view illustrating a light emitting device package.

A package body 110 has a cavity, and a light emitting device 130 is placed on a bottom surface of the cavity. A radiator 180 may be disposed in a lower portion of the package body 110. The radiator 180 and the light emitting device 130 may be fixed to each other via a conductive adhesive layer 120.

However, the light emitting device package has problems as follows.

In FIG. 1, the radiator 180 may be formed of a high thermal-conductivity material. As the light emitting device 130 of the light emitting device package 100 may emit heat, the radiator 180 may undergo deterioration of planarity due to a difference in coefficients of thermal expansion between different constituent materials of the package body 110 and the radiator 180.

That is, in FIG. 1, the radiator 180 may have a roughened surface other than a flat surface due to volumetric expansion of the radiator 180, which causes tilting of the light emitting device 130, and consequently tilting of a light emission angle of the light emitting device package 100. In addition, the roughened radiator 180 provided at a lower surface of the light emitting device package 100 may cause the light emitting device package 100 to tilt when mounted onto a circuit board and the like.

SUMMARY

Embodiments provide improved reliability of a light emitting device package.

In one embodiment, a light emitting device package includes a package body having a package body having a through-hole; a radiator disposed in the through-hole and including an alloy layer having Cu; and a light emitting device disposed on the radiator, wherein the alloy layer includes at least one of W or Mo, and wherein the package body comprises cavity including a sidewall and a bottom surface, and wherein the through-hole is formed in the bottom surface.

In another embodiment, a light emitting device package includes a package body having a cavity defined by a sidewall and a bottom surface and a through-hole formed in the bottom surface; a radiator disposed in the through-hole and exposed outside from a lower surface of the package body; and a light emitting device electrically connected to the radiator.

In accordance with a further embodiment, a light unit includes a light emitting device package. The light emitting device package includes, a package body having a through-hole; a radiator disposed in the through-hole and including an alloy layer having Cu; and a light emitting device disposed on the radiator and electrically connected to the radiator.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
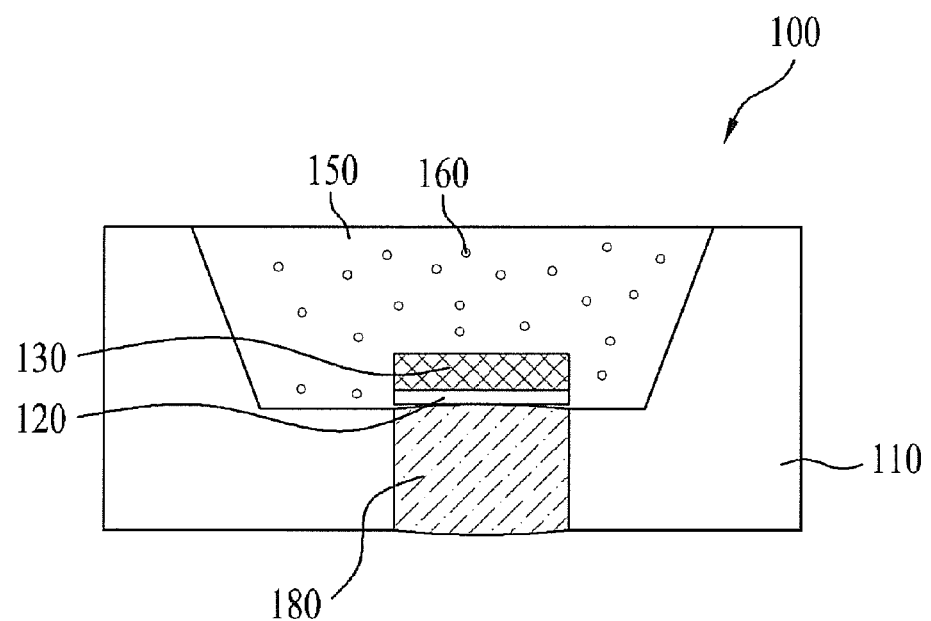
FIG. 1 is a view illustrating a light emitting device package.

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element. Also, it will also be understood that criteria of on or under is on the basis of the drawing.

In the drawings, dimensions of layers are exaggerated, omitted or schematically illustrated for clarity and description convenience. In addition, dimensions of constituent elements do not entirely reflect actual dimensions.

Figure 2:
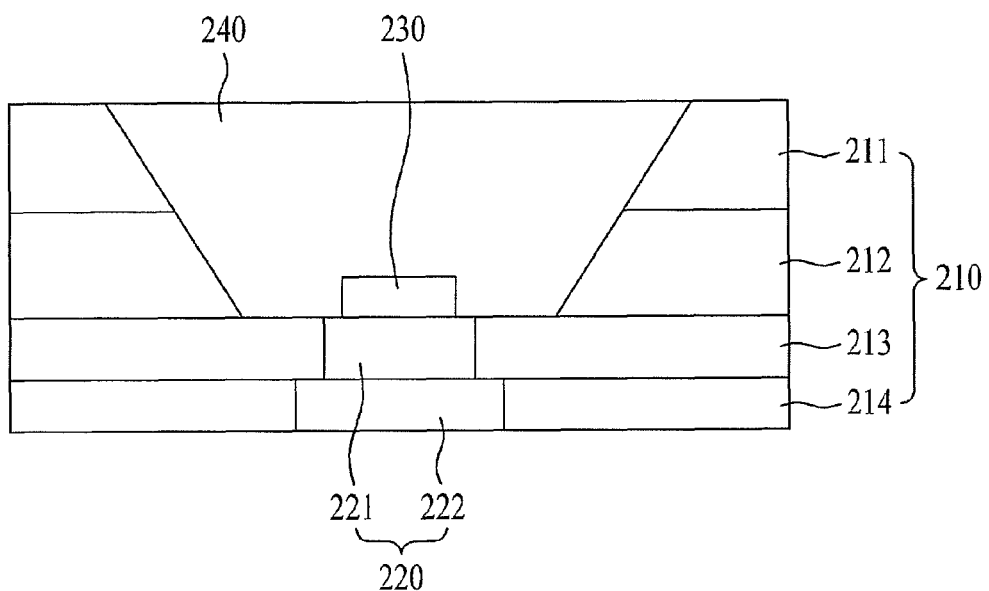
FIG. 2 is a view illustrating a light emitting device package according to a first embodiment.
Figure 3:
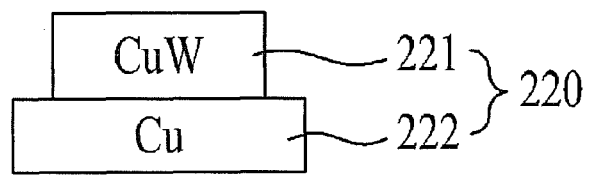
FIGS. 3 and 4 are views illustrating only a radiator included in the light emitting device package of FIG. 2.
Figure 4:
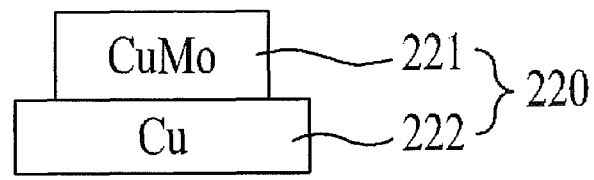

FIG. 2 is a view illustrating a light emitting device package according to a first embodiment, and FIGS. 3 and 4 are views illustrating only a radiator included in the light emitting device package of FIG. 2.

The light emitting device package 200 according to the first embodiment, as illustrated in FIG. 2, may include a package body 210, a radiator 220, and a light emitting device 230.

The package body 210 may be a stack of a plurality of layers. Although FIG. 2 illustrates the case in which the package body 210 includes a first layer 211, a second layer 212, a third layer 213, and a fourth layer 214, the package body 210 may have more or fewer layers. Also, the package body 210 may be formed into a single layer.

The package body 210 may include a plurality of insulating layers. The package body 210 may be formed of an insulating material, such as a nitride or oxide. Also, the package body 210 may include a plurality of ceramic layers. For example, the package body 210 may be formed by a Low Temperature Co-fired Ceramic (LTCC) method. Also, the package body 210 may be formed by a High Temperature Co-fired Ceramic (HTCC) method. A constituent material of the package body 210 may be $SiO_2$, $Si_xO_y$, $Si_3N_4$, $Si_xN_y$, $SiO_xN_y$, $Al_2O_3$, or AlN. For example, the package body 210 may be formed of AlN, or a metal nitride having thermal conductivity of 140 W/mK or more.

The respective layers 211, 212, 213 and 214 of the package body 210 may have the same thickness, or at least one of the layers may have a different thickness. The layers 211, 212, 213 and 214 of the package body 210 may be individual layers obtained by different fabrication processes, and may be integrated with one another after completion of firing.

An electrode pattern may be formed between the respective layers of the package body 210, and power may be applied to the light emitting device 230 through the electrode pattern. The power may be applied to the light emitting device 230 through a via-hole structure.

An upper inner surface of the package body 210 may be an inclined surface. A reflective material may be provided in the inclined inner surface of the package body 210. Accordingly, the package body 210 may reflect light emitted from the light emitting device 230 to extract the light to the outside.

According to an embodiment, the package body 210 may have a cavity and the light emitting device 230 may be disposed in the cavity. A sidewall of the cavity may be formed by an inclined surface.

A molded part 240 may be provided over the light emitting device 230. The molded part 240 serves to protect the light emitting device 230 by intercepting foreign substances, moisture and the like introduced from the outside. Also, the molded part 240 may contain a fluorescent material, and may provide wavelength-converted light upon receiving light emitted from the light emitting device 230.

A through-hole may be formed in a lower portion of the package body 210. The radiator 220 may be disposed in the through-hole of the package body 210. In the case in which a cavity is formed in the package body 210 according to an embodiment, the through-hole may be formed in the bottom of the cavity. The light emitting device 230 may be disposed over the radiator 220. The light emitting device 230 may come into contact with the radiator 220. The radiator 220 is able to efficiently transfer heat generated from the light emitting device 230 to the outside. The radiator 220 may be exposed to the outside. The radiator 220 may include an alloy layer 221 containing copper (Cu), and a Cu layer 222 disposed beneath the alloy layer 221. The alloy layer 221 containing Cu may have a smaller horizontal cross sectional area than that of the Cu layer 222.

According to one embodiment, the radiator 220, as illustrated in FIG. 3, may include the alloy layer 221 containing Cu—W, and the Cu layer 222 disposed beneath the alloy layer 221. According to another embodiment, the radiator 220, as illustrated in FIG. 4, may include the alloy layer 221 containing Cu—Mo, and the Cu layer 222 disposed beneath the alloy layer 221. The alloy layer 221 may contain at least one element of W and Mo.

In the embodiment, the radiator 220 includes the alloy layer 221 containing Cu and the Cu layer 222. A Cu layer has low processability, but has very excellent heat transfer properties. However, the Cu layer has a high coefficient of thermal expansion, which is considerably different from that of the light emitting device 230. Accordingly, thermal expansion and contraction stress is transmitted to the light emitting device 230 upon temperature change, which may cause damage to the light emitting device 230. To solve this problem, in the embodiment, the radiator 220 is configured such that the Cu layer 222 serves as a lower layer and the alloy layer 221 containing Cu is stacked over the Cu layer 222. With this configuration, the light emitting device 230 comes into contact with the alloy layer 221 other than the Cu layer 222. In the above mentioned embodiments, the alloy layer 221 may be a Cu—W alloy layer or a Cu—Mo alloy layer. Since the Cu—W alloy layer and Cu—Mo alloy layer have coefficients of thermal expansion similar to that of the light emitting device 230, it is possible to prevent damage to the light emitting device 230 due temperature change. The alloy layer 221 may contain at least one material of W and Mo. The alloy layer 221 may include Cu—W, Cu—Mo, and Cu—W—Mo layers.

Additionally, in the embodiment, the radiator 220 takes the form of a stack of a plurality of layers, which may prevent upward bulging of an upper surface of the radiator 220. In this way, the light emitting device 230 disposed over the radiator 220 may be stably disposed.

Figure 5:
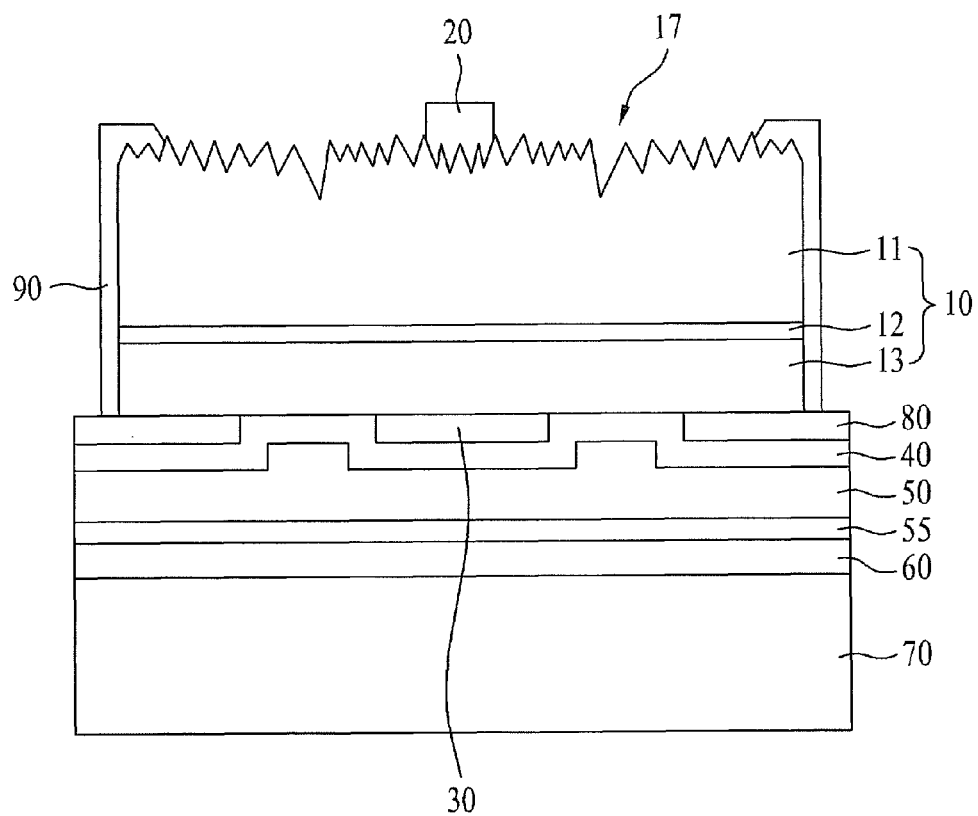
FIG. 5 is a view illustrating a light emitting device that may be applied to the light emitting device package according to the first embodiment.

FIG. 5 is a view illustrating a light emitting device that may be applied to the light emitting device package according to the first embodiment.

The light emitting device according to the embodiment, as illustrated in FIG. 5, may include a light emitting structure 10, an electrode 20, and a reflective electrode 50.

The light emitting structure 10 may include a first conductive semiconductor layer 11, an active layer 12, and a second conductive semiconductor layer 13. The first conductive semiconductor layer 11 may have a roughened upper surface 17.

In one example, the first conductive semiconductor layer 11 may be an n-type semiconductor layer, to which a first conductive dopant, i.e. an n-type dopant is added, and the second conductive semiconductor layer 13 may be a p-type semiconductor layer, to which a second conductive dopant, i.e. a p-type dopant is added. In another example, the first conductive semiconductor layer 11 may be a p-type semiconductor layer, and the second conductive semiconductor layer 13 may be an n-type semiconductor layer.

The first conductive semiconductor layer 11 may include an n-type semiconductor layer. The first conductive semiconductor layer 11 may be formed of a semiconductor material having a composition of $In_xAl_yGa_{1-x-y}N$ ($0 \leq x \leq 1$, $0 \leq y \leq 1$, $0 \leq x+y \leq 1$). For example, the first conductive semiconductor layer 11 may be selected from among GaN, AlN, AlGaN, InGaN, InN, InAlGaN, AlInN, AlGaAs, GaP, GaAs, GaAsP, AlGaInP and the like, and may be doped with an n-type dopant, such as Si, Ge, Sn, Se, Te and the like.

The active layer 12 is adapted to emit light via an energy band gap depending on constituent materials of the active layer 12, i.e. pairs of electrons (or holes) introduced through the first conductive semiconductor layer 11 and holes (or electrons) introduced through the second conductive semiconductor layer 12. The active layer 12 may have any one structure of a Single Quantum Well (SQW), Multi Quantum Well (MQW), quantum dot and quantum wire structures, but the disclosure is not limited thereto.

The active layer 12 may be formed of a semiconductor material having a composition of $In_xAl_yGa_{1-x-y}N$ ($0 \leq x \leq 1$, $0 \leq y \leq 1$, $0 \leq x+y \leq 1$). If the active layer 12 has a MQW structure, the active layer 12 may be a stack of a plurality of well layers and a plurality of barrier layers. For example, the active layer 12 may be a periodic stack of InGaN well/GaN barrier layers.

The second conductive semiconductor layer 13 may include a p-type semiconductor layer. The second conductive semiconductor layer 13 may be formed of a semiconductor material having a composition of $In_xAl_yGa_{1-x-y}N$ ($0 \leq x \leq 1$, $0 \leq y \leq 1$, $0 \leq x+y \leq 1$). For example, the second conductive semiconductor layer 13 may be selected from among GaN, AlN, AlGaN, InGaN, InN, InAlGaN, AlInN, AlGaAs, GaP, GaAs, GaAsP, AlGaInP and the like, and may be doped with a p-type dopant, such as Mg, Zn, Ca, Sr, Ba and the like.

Meanwhile, the first conductive semiconductor layer 11 may include a p-type semiconductor layer, and the second conductive semiconductor layer 13 may include an n-type semiconductor layer. A semiconductor layer including an n-type or p-type semiconductor layer may be further formed beneath the second conductive semiconductor layer 13. In this way, the light emitting structure 10 may have at least any one of np, pn, npn, pnp junction structures. Also, the first conductive semiconductor layer 11 and the second conductive semiconductor layer 13 may have an even or uneven dopant doping concentration. That is, the light emitting structure 10 may have various structures, but the disclosure is not limited thereto.

A first conductive InGaN/GaN super-lattice structure or InGaN/InGaN super-lattice structure may be formed between the first conductive semiconductor layer 11 and the active layer 12. Also, a second conductive AlGaN layer may be formed between the second conductive semiconductor layer 13 and the active layer 12.

The first conductive semiconductor layer 11 may have the roughened upper surface 17. If the first conductive semiconductor layer 11 is a GaN layer, the roughened surface 17 may be an N surface in consideration of growth and etching directions.

An ohmic contact layer 40 and the reflective electrode 50 may be disposed below the light emitting structure 10. The electrode 20 may be disposed over the light emitting structure 10. The electrode 20 and the reflective electrode 50 may apply power to the light emitting structure 10. The ohmic contact layer 40 may come into ohmic contact with the light emitting structure 10. The reflective electrode 50 may function to reflect light directed from the light emitting structure 10 so as to increase the extraction quantity of light to the outside.

The ohmic contact layer 40, for example, may be a transparent conductive oxide film layer. The ohmic contact layer 40 may be formed of at least one material selected from among Indium Tin Oxide (ITO), Indium Zinc Oxide (IZO), Aluminum Zinc Oxide (AZO), Aluminum Gallium Zinc Oxide (AGZO), Indium Zinc Tin Oxide (IZTO), Indium Aluminum Zinc Oxide (IAZO), Indium Gallium Zinc Oxide (IGZO), Indium Gallium Tin Oxide (IGTO), Antimony Tin Oxide (ATO), Gallium Zinc Oxide (GZO), IZO nitride (IZON), ZnO, $IrO_x$, $RuO_x$, and NiO.

The reflective electrode 50 may be formed of a high reflectivity metal material. For example, the reflective electrode 50 may be formed of a metal including at least one of Ag, Ni, Al, Rh, Pd, Ir, Ru, Mg, Zn, Pt, Cu, Au, and Hf and alloys thereof. Also, the reflective electrode 50 may be formed into multiple layers using light-transmissive conductive materials, such as Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), and the like. For example, in the embodiment, the reflective electrode 50 may be formed of at least any one of Ag, Al, Ag—Pd—Cu alloy, and Ag—Cu alloy.

A Current Blocking Layer (CBL) 30 may be provided between the light emitting structure 10 and the ohmic contact layer 40. The current blocking layer 30 may be formed at a region that at least partially vertically overlaps with the electrode 20. This alleviates concentration of current on the shortest distance between the electrode 20 and the reflective electrode 50, resulting in improved light emission efficiency of the light emitting device according to the embodiment.

The current blocking layer 30 may have electric insulation properties, or may be formed of a material that defines a schottky contact with the light emitting structure 10. The current blocking layer 30 may be formed of an oxide, nitride, or metal. For example, the current blocking layer 30 may be formed of at least one of $SiO_2$, $SiO_x$, $SiO_xN_y$, $Si_3N_4$, $Al_2O_3$, $TiO_x$, Ti, Al, and Cr.

The current blocking layer 30 may be disposed at a first region immediately beneath the light emitting structure 10, and the ohmic contact layer 40 may be disposed at a second region beneath the light emitting structure 10 and immediately beneath the current blocking layer 30. The ohmic contact layer 40 may be disposed between the light emitting structure 10 and the reflective electrode 50. Also, the ohmic contact layer 40 may be disposed between the current blocking layer 30 and the reflective electrode 50.

An isolation layer 80 may further be disposed between the light emitting structure 10 and the ohmic contact layer 40. The isolation layer 80 may be disposed at a lower periphery of the light emitting structure 10 and over the ohmic contact layer 40. For example, the isolation layer 80 may be formed of an electrically insulating material, or a lower electric conductivity material than that of the light emitting structure 10. The isolation layer 80 may be formed of an oxide or nitride. The isolation layer 80 may be formed of at least one selected from the group consisting of $SiO_2$, $Si_xO_y$, $Si_3N_4$, $Si_xN_y$, $SiO_xN_y$, $Al_2O_3$, $TiO_2$, ITO, AZO, ZnO and the like. The isolation layer 80 may be formed of the same material as or a different material than that of the current blocking layer 30. The isolation layer 80 may be referred to as a channel layer.

A diffusion barrier layer 55, a bonding layer 60, and a support member 70 may be disposed beneath the reflective electrode 50.

The diffusion barrier layer 55 may function to prevent a material contained in the bonding layer 60 from being diffused toward the reflective electrode 50 during formation of the bonding layer 60. That is, the diffusion barrier layer 55 may prevent a material, such as for example, tin (Sn), contained in the bonding layer 60 from having an effect on the reflective electrode 50 and the like. The diffusion barrier layer 55 may be formed of at least one of Cu, Ni, Ti—W, W, and Pt.

The bonding layer 60 may be formed of a barrier metal or bonding metal. For example, the bonding layer 60 may be formed of at least one of Ti, Au, Sn, Ni, Cr, Ga, In, Bi, Cu, Ag and Ta. The support member 70 serves to support the light emitting device according to the embodiment, and may be electrically connected to an external electrode so as to apply power to the light emitting structure 10. For example, the support member 70 may be formed of at least any one of Ti, Cr, Ni, Al, Pt, Au, W, Cu, Mo, Cu—W or dopant (e.g., Si, Ge, GaN, GaAs, ZnO, SiC, SiGe and the like) implanted semiconductor wafers. Also, the support member 70 may be formed of an insulating material.

A protective layer 90 may be further provided over the light emitting structure 10. The protective layer 90 may be formed of an oxide or nitride. For example, the protective layer 90 may be formed of a material having light transmission and insulation properties, such as $SiO_2$, $SiO_x$, $SiO_xN_y$, $Si_3N_4$, and $Al_2O_3$. The protective layer 90 may be provided at a lateral surface of the light emitting structure 10. Also, the protective layer 90 may be provided at an upper surface of the light emitting structure 10 as well as the lateral surface of the light emitting structure 10.

The above description is based on a vertical type light emitting device in which the electrode 20 is disposed above the light emitting structure 10 and the reflective electrode 50 is disposed below the light emitting structure 10. However, the light emitting device according to the present embodiment may be altered in various ways in relation to positions and shapes of a first electrode electrically connected to the first conductive semiconductor layer 11 and a second electrode electrically connected to the second conductive semiconductor layer 13 of the light emitting structure 10. Also, the light emitting device according to the present embodiment may be applied to a horizontal type light emitting device in which the first electrode and the second electrode are exposed in the same direction.

Figure 6:
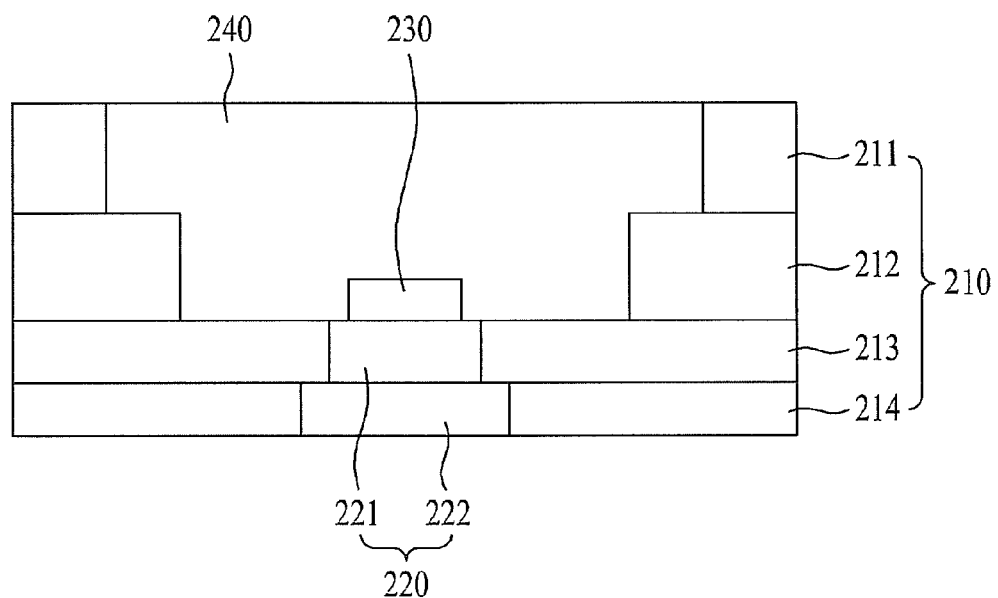
FIG. 6 is a view illustrating a light emitting device package according to a second embodiment.

FIG. 6 is a view illustrating a light emitting device package according to a second embodiment. Contents overlapped with the above described embodiment will not be described again.

The light emitting device package 200 according to the second embodiment, as illustrated in FIG. 6, may include a package body 210, the radiator 220, and the light emitting device 230.

The package body 210 may be a stack of a plurality of layers. Although FIG. 6 illustrates the case in which the package body 210 includes a first layer 211, a second layer 212, a third layer 213, and a fourth layer 214, the package body 210 may have more or fewer layers. Also, the package body 210 may be formed into a single layer.

The package body 210 may include a plurality of insulating layers. The package body 210 may be formed of an insulating material, such as a nitride or oxide. Also, the package body 210 may include a plurality of ceramic layers. For example, the package body 210 may be formed by a LTCC method. Also, the package body 210 may be formed by a HTCC method. A constituent material of the package body 210 may be $SiO_2$, $Si_xO_y$, $Si_3N_4$, $Si_xN_y$, $SiO_xN_y$, $Al_2O_3$, or AlN. For example, the package body 210 may be formed of AlN, or a metal nitride having thermal conductivity of 140 W/mK or more.

The respective layers 211, 212, 213 and 214 of the package body 210 may have the same thickness, or at least one of the layers may have a different thickness. The layers 211, 212, 213 and 214 of the package body 210 may be individual layers obtained by different fabrication processes, and may be integrated with one another after completion of firing.

An electrode pattern may be formed between the respective layers of the package body 210, and power may be applied to the light emitting device 230 through the electrode pattern. The power may be applied to the light emitting device 230 through a via-hole structure.

An upper inner surface of the package body 210 may be a stepped surface. A reflective material may be provided in the stepped inner surface of the package body 210. Accordingly, the package body 210 may reflect light emitted from the light emitting device 230 to extract the light to the outside.

A through-hole may be formed in a lower portion of the package body 210. The radiator 220 may be disposed in the through-hole of the package body 210. The light emitting device 230 may be disposed over the radiator 220. The light emitting device 230 may come into contact with the radiator 220. The radiator 220 is able to efficiently transfer heat generated from the light emitting device 230 to the outside. The radiator 220 may be exposed to the outside.

The radiator 220 may include the alloy layer 221 containing copper (Cu), and the Cu layer 222 disposed beneath the alloy layer 221. The alloy layer 221 containing Cu may have a smaller horizontal cross sectional area than that of the Cu layer 222.

According to one embodiment, the radiator 220 may include the alloy layer 221 containing Cu and the Cu layer 222. A Cu layer has low processability, but has very excellent heat transfer properties. However, the Cu layer has a high coefficient of thermal expansion, which is considerably different from that of the light emitting device 230. Accordingly, thermal expansion and contraction stress is transmitted to the light emitting device 230 upon temperature change, which may cause damage to the light emitting device 230. To solve this problem, in the embodiment, the radiator 220 is configured such that the Cu layer 222 serves as a lower layer and the alloy layer 221 containing Cu is stacked over the Cu layer 222. With this configuration, the light emitting device 230 comes into contact with the alloy layer 221 other than the Cu layer 222. In the above mentioned embodiments, the alloy layer 221 may be a Cu—W alloy layer or a Cu—Mo alloy layer. Since the Cu—W alloy layer and Cu—Mo alloy layer have coefficients of thermal expansion similar to that of the light emitting device 230, it is possible to prevent damage to the light emitting device 230 due to temperature change. The alloy layer 221 may contain at least one material of W and Mo. The alloy layer 221 may include Cu—W, Cu—Mo, and Cu—W—Mo layers.

Additionally, in the embodiment, the radiator 220 takes the form of a stack of a plurality of layers, which may prevent upward bulging of an upper surface of the radiator 220. In this way, the light emitting device 230 disposed over the radiator 220 may be stably disposed.

Figure 7:
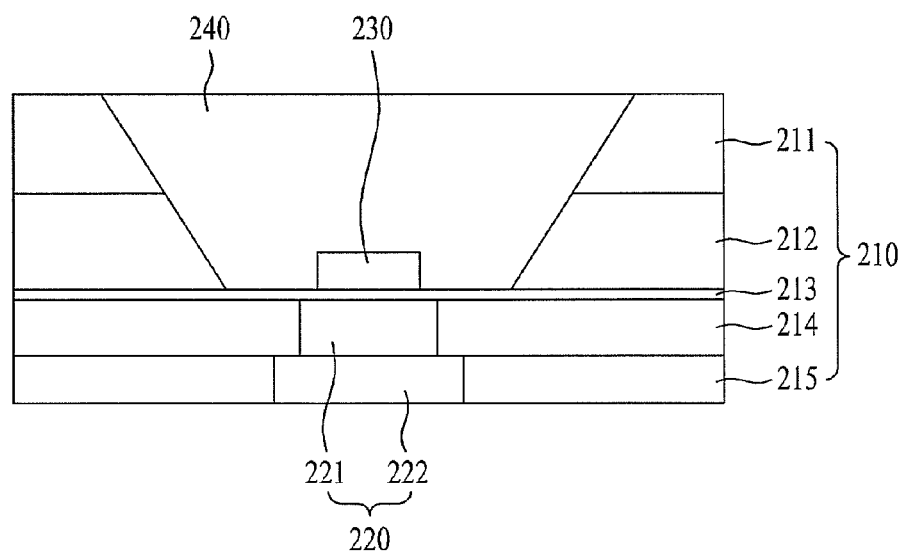
FIG. 7 is a view illustrating a light emitting device package according to a third embodiment.

FIG. 7 illustrates a light emitting device package according to a third embodiment. Contents overlapped with the above described embodiments will not be described again.

The light emitting device package 200 according to the third embodiment, as illustrated in FIG. 7, may include the package body 210, the radiator 220, and the light emitting device 230.

The package body 210 may be a stack of a plurality of layers. Although FIG. 7 illustrates the case in which the package body 210 includes the first layer 211, the second layer 212, the third layer 213, the fourth layer 214, and a fifth layer 215, the package body 210 may have more or fewer layers. Also, the package body 210 may be formed into a single layer.

The package body 210 may include a plurality of insulating layers. The package body 210 may be formed of an insulating material, such as a nitride or oxide. Also, the package body 210 may include a plurality of ceramic layers. The package body 210 may include a green sheet. For example, the package body 210 may be formed by a LTCC method. Also, the package body 210 may be formed by a HTCC method. A constituent material of the package body 210 may be $SiO_2$, $Si_xO_y$, $Si_3N_4$, $Si_xN_y$, $SiO_xN_y$, $Al_2O_3$, or AlN. For example, the package body 210 may be formed of AlN, or a metal nitride having thermal conductivity of 140 W/mK or more.

An upper inner surface of the package body 210 may be an inclined surface. A reflective material may be provided in the inclined inner surface of the package body 210. Accordingly, the package body 210 may reflect light emitted from the light emitting device 230 to extract the light to the outside. The first layer 211 and the second layer 212 constituting the package body 210 may be referred to as extension layers. The extension layers may be stacked so as to be disposed around the light emitting device 230. The package body 210 may include a cavity that is defined by the extension layers and has bottom and inner lateral surfaces. The inner lateral surface of the cavity may be an inclined surface. The third layer 213 may be referred to as a support layer. The third layer 213 may support the light emitting device 230, and also may support the radiator 220 during formation of the radiator 220. Specifically, the third layer 213 may serve as an anti-bulging layer to prevent the radiator 220 from being thermally expanded and bulging toward the light emitting device 230.

A recess may be indented in a lower portion of the package body 210. The recess may be disposed above a support structure that supports the package body 210. For example, the support structure may include the fifth layer 215 that comes into contact with the radiator 220. The radiator 220 may be disposed in the recess of the package body 210. The light emitting device 230 may be disposed above the radiator 220. The third layer 213 may be disposed between the light emitting device 230 and the radiator 220. The third layer 213 may have a small thickness to ensure efficient transfer of heat generated from the light emitting device 230 to the radiator 220. For example, the thickness of the third layer 213 may be in a range of 40 μm to 60 μm.

The radiator 220 is adapted to efficiently transfer heat generated from the light emitting device 230 to the outside. The radiator 220 may be exposed to the outside. The radiator 220 may include the alloy layer 221 containing Cu, and the Cu layer 222 disposed beneath the alloy layer 221. The alloy layer 221 containing Cu may have a smaller horizontal cross sectional area than that of the Cu layer 222.

In the embodiment, as a result of disposing the third layer 213 over the radiator 220, it is possible to prevent upward bulging of the upper surface of the radiator 220. The third layer 213, for example, may be formed of a green sheet, and may have a flat upper surface. Accordingly, the light emitting device 230 may be disposed over the third layer 213 via, e.g., eutectic bonding.

For example, the radiator 220 may be formed by filling the recess of the package body 210 with sintered pieces, pellets, a rod, fine powder, paste or the like, and thereafter performing firing. In this way, the light emitting device 230 may be stably disposed over the radiator 220. A separate thin film, for example, a green sheet having a thickness in a range of 40 μm to 60 μm may be disposed beneath the radiator 220.

Figure 8:
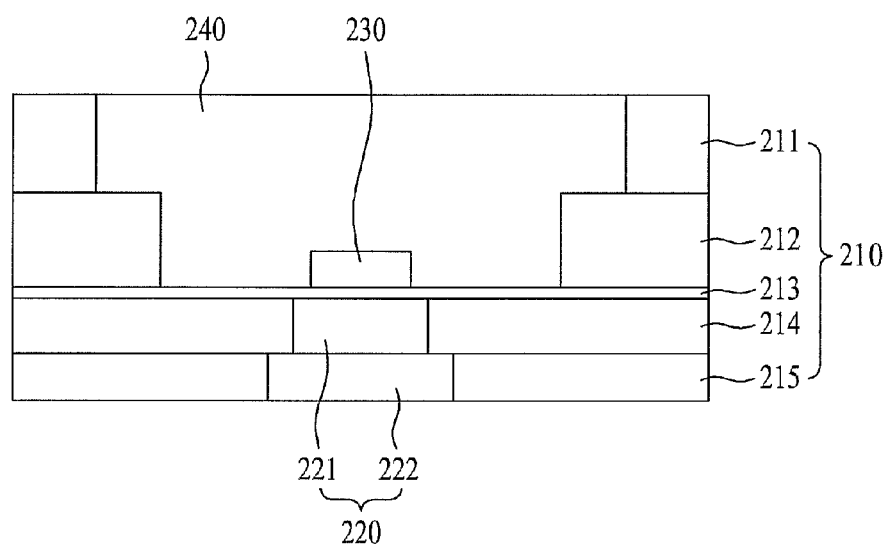
FIG. 8 is a view illustrating a light emitting device package according to a fourth embodiment.

FIG. 8 is a view illustrating a light emitting device package according to a second embodiment. Contents overlapped with the above described embodiment will not be described again.

The light emitting device package 200 according to the fourth embodiment, as illustrated in FIG. 8, may include the package body 210, the radiator 220, and the light emitting device 230.

The upper inner surface of the package body 210 may be stepped. A reflective material may be provided in the stepped inner surface of the package body 210. Accordingly, the package body 210 may reflect light emitted from the light emitting device 230 to extract the light to the outside. The first layer 211 and the second layer 212 constituting the package body 210 may be referred to as extension layers. The extension layers may be stacked so as to be disposed around the light emitting device 230. The package body 210 may include a cavity that is defined by the extension layers and has bottom and inner lateral surfaces. The inner lateral surface of the cavity may be stepped. The third layer 213 may be referred to as a support layer. The third layer 213 may support the light emitting device 230, and also may support the radiator 220 during formation of the radiator 220.

Figure 9A:
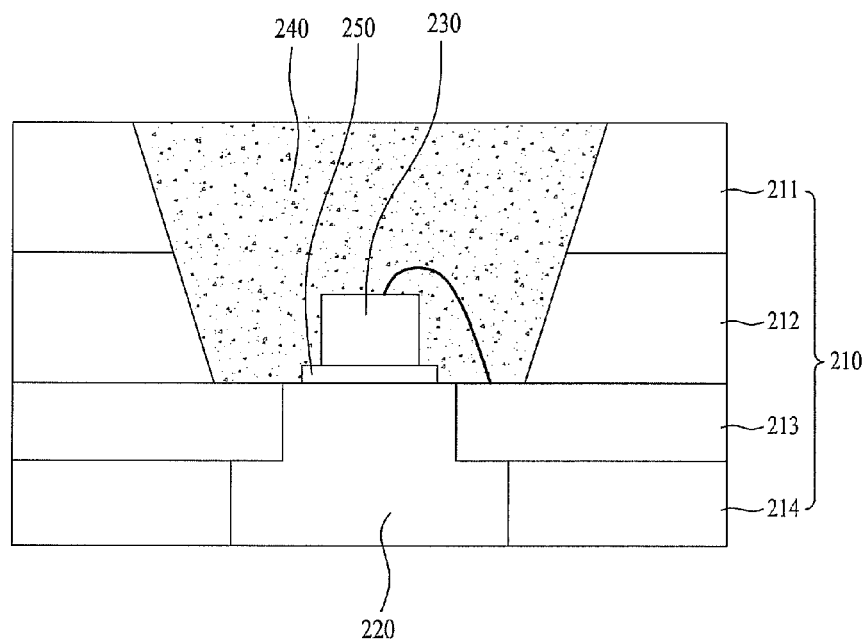
FIG. 9A is a view illustrating a light emitting device package according to a fifth embodiment.
Figure 9B:
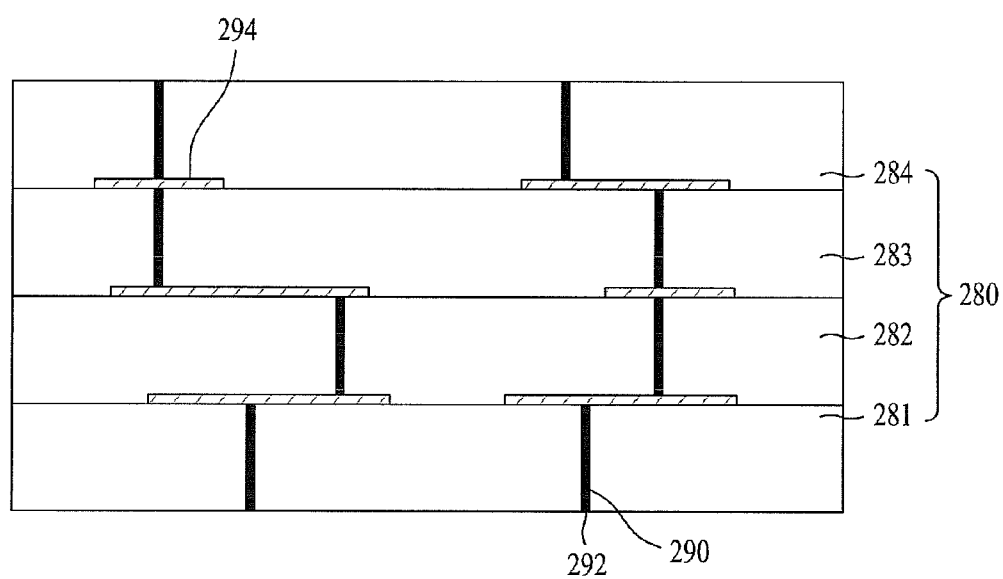
FIG. 9B is a view illustrating an embodiment of a method for forming a circuit pattern in a package body.

FIG. 9A is a view illustrating a light emitting device package according to a fifth embodiment, and FIG. 9B is a view illustrating a method for forming a circuit pattern in the package body. Contents overlapped with the above described embodiment will not be described again.

The light emitting device package 200 according to the fifth embodiment, as illustrated in FIG. 9A, may include the package body 210, the radiator 220, and the light emitting device 230.

The package body 210 has a through-hole, and the radiator 220 is inserted into the through-hole. An inner surface of the through-hole and an outer surface of the radiator 220, which come into contact with each other, are respectively provided with patterns to increase a contact area, which may increase heat radiation effects.

Although FIG. 9A illustrates the patterns as having a stepped shape, the shape of the patterns is not particularly limited.

A circuit pattern is formed in the package body 210 using electrode patterns and penetrating electrodes.

Referring to FIG. 9B, first, a plurality of green sheets 280 is fabricated using a mixture of ceramic and a binder. Then, in consideration of the entire package body 210, via-holes 290 are formed at accurate positions through each of the plurality of green sheets 281 to 284, and electrode patterns 294 connected to the via-holes 290 are formed. In this case, the electrode patterns 294 may be formed prior to forming the via-holes 290. Then, an electrode material is filled into the via-holes 290 to form penetrating electrodes 292. The electrode material may be applied only to inner walls of the via-holes 290, or may be filled in the entire via-holes 290.

As an electrode pattern disposed below the package body 210 acts as an electrode pad connected to the electrodes of the substrate, supply of power to the light emitting device 230 may be accomplished.

The light emitting device 230 may be electrically connected to the radiator 220 via a conductive adhesive layer 250. That is, the radiator 220 may be formed of a material having thermal conductivity and electric conductivity, and may be electrically connected to the electrode pattern of the package body 210. As the light emitting device 230 is bonded to the radiator 220 via the conductive adhesive layer 250, direct conduction between the light emitting device 230 and the radiator 210 may be realized without separate wire bonding. The conductive adhesive layer 250, for example, may be formed of Ag paste or Au—Sn metals.

Figure 10:
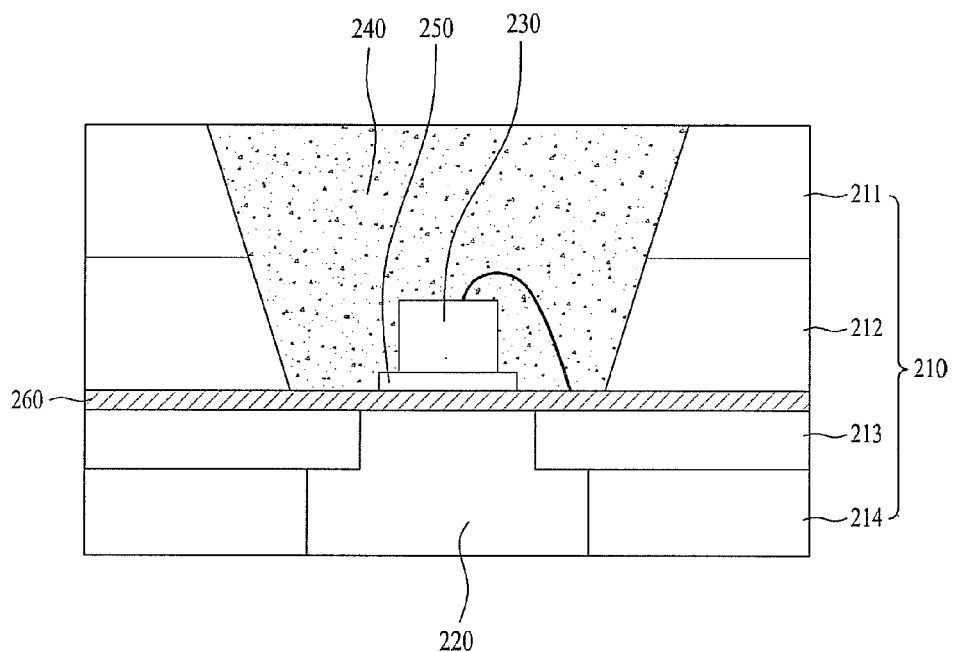
FIG. 10 is a view illustrating a light emitting device package according to a sixth embodiment.

FIG. 10 is a view illustrating a light emitting device package according to a sixth embodiment. Contents overlapped with the above described embodiment will not be described again.

The light emitting device package 200 according to the sixth embodiment, as illustrated in FIG. 10, may include the package body 210, the radiator 220, and the light emitting device 230.

The package body 210 includes an anti-bulging layer 260 disposed between the light emitting device 230 and the radiator 220.

The package body 210 and the radiator 220 are formed of different materials and have a difference in coefficients of thermal expansion. Therefore, after the radiator 220 in the form of a radiating block is inserted into the package body 210, the radiator 220 and the package body 210 may be subjected to co-firing. Also, as the radiator 220 is expanded by heat generated from the light emitting device 230 during use of the light emitting device package, the upper surface of the radiator 220, on which the light emitting device 230 is mounted, may convexly bulge.

Once the upper surface of the radiator 220 has convexly bulged, a contact failure between the radiator 220 and the light emitting device 230 occurs, causing deterioration in reliability. Accordingly, providing the anti-bulging layer 260 between the light emitting device 230 and the radiator 220 may prevent the upper surface of the radiator 220 from bulging toward the light emitting device 230.

The anti-bulging layer 260 may be separately prepared, and then be disposed on the package body 210, or may be integrally formed with the package body 210 to constitute a part of the package body 210.

The anti-bulging layer 260 may be provided with an electrode pattern to electrically connect the light emitting device 230 and the anti-bulging layer 260 to each other.

The anti-bulging layer 260 may be formed beneath the radiator 220 other than being formed between the light emitting device 230 and the radiator 220.

Figure 11:
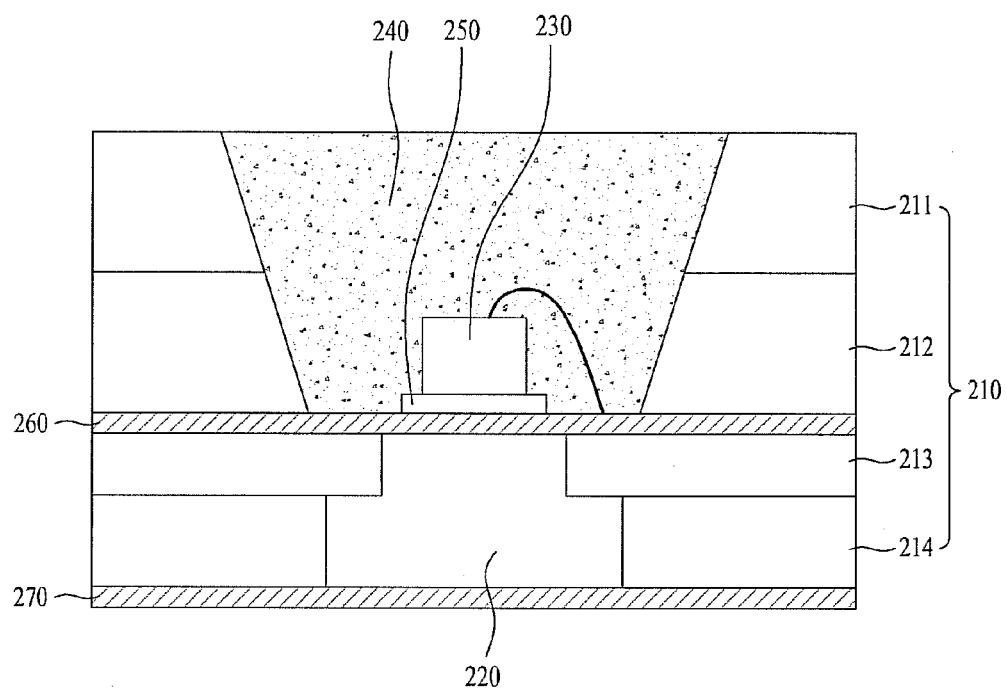
FIG. 11 is a view illustrating a light emitting device package according to a seventh embodiment.

FIG. 11 is a view illustrating a light emitting device package according to a seventh embodiment. Contents overlapped with the above described embodiment will not be described again.

The light emitting device package 200 according to the seventh embodiment, as illustrated in FIG. 11, may include the package body 210, the radiator 220, and the light emitting device 230.

The package body 210 includes the anti-bulging layer 260 disposed between the light emitting device 230 and the radiator 220, and an anti-bulging layer 270 disposed beneath the radiator 220.

In consideration of the fact that a lower surface as well as the upper surface of the radiator 220 may convexly bulge, the anti-bulging layers 260 and 270 may be respectively formed at both the upper and lower surfaces of the radiator 220.

The anti-bulging layers 260 and 270 may be separately prepared, and then be disposed on the package body 210, or may be integrally formed with the package body 210 to constitute a part of the package body 210.

Figure 12:
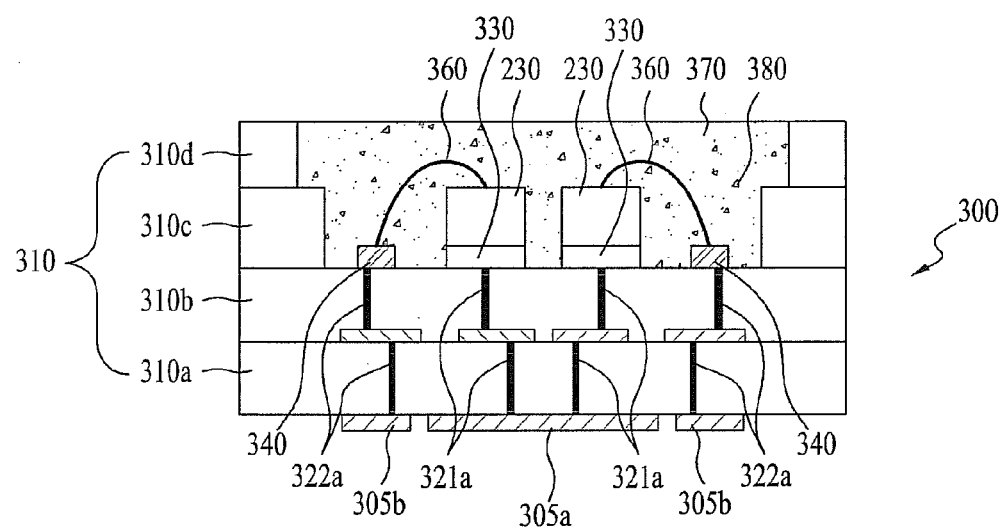
FIG. 12 is a view illustrating a light emitting device package according to an eighth embodiment.

FIG. 12 is a view illustrating a light emitting device package according to an eighth embodiment. Contents overlapped with the above described embodiment will not be described again.

In the light emitting device package 300 according to the eighth embodiment, a package body 310 includes a plurality of ceramic layers 310a, 310b, 310c and 310d. The package body 310 may be formed using an HTCC or LTCC method.

If the package body 310 is a multilayered ceramic substrate, the respective layers may have the same thickness or have a difference in thickness. The package body 310 may be formed of an insulating material, such as a nitride or oxide. For example, the package body 310 may be formed of $SiO_2$, $Si_xO_y$, $Si_3N_4$, $Si_xN_y$, $SiO_xN_y$, $Al_2O_3$, or AlN.

The plurality of ceramic layers 310a, 310b, 310c and 310d may have different widths. Some layers 310a and 310b may define the bottom of the light emitting device package 300 or a cavity, and the other layers 310c and 310d may define a sidewall of the cavity.

The light emitting device 230 is disposed on the bottom of the cavity that is defined by the plurality of ceramic layers 310a, 310b, 310c and 310d as described above. In the present embodiment, at least one light emitting device is provided, and for example, four light emitting devices 230 may be provided.

The light emitting device 230 includes a Light Emitting Diode (LED) using a plurality of compound semiconductor layers, for example, group III-V compound semiconductor layers. The light emitting device may be a colored light emitting device that emits red, green or blue light, or a UV light emitting device that emits ultraviolet light (UV).

Since the package body 310 is a ceramic substrate formed of inorganic LTCC or HTCCs, even if the light emitting device 230 including a deep-UV LED having a wavelength of about 260 nm to about 280 nm or a near-UV LED having a wavelength of about 365 nm to about 405 nm is used, there is no risk of the package body 310 being discolored or deteriorated by ultraviolet light (a wavelength of about 260 nm to about 405 nm) emitted from the light emitting device 230, and it is possible to maintain reliability of a light emitting module.

Figure 13A:
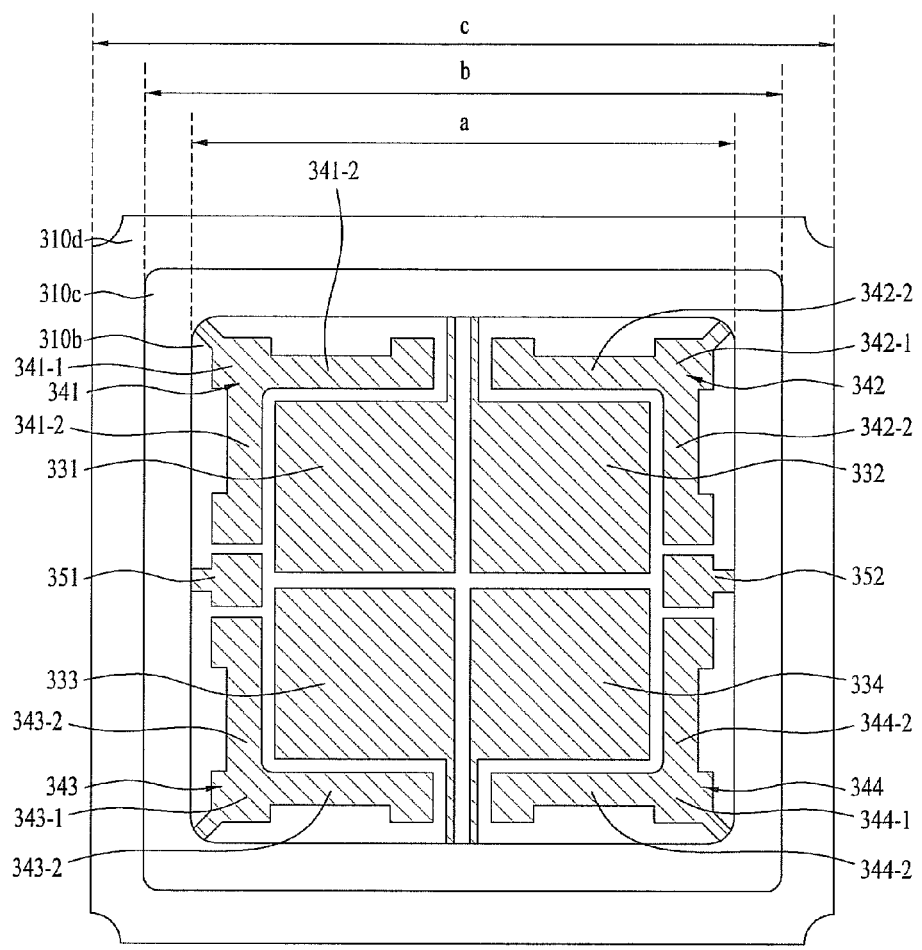
FIGS. 13A to 13C are views illustrating the arrangement of electrode patterns included in the light emitting device package of FIG. 12.
Figure 13B:
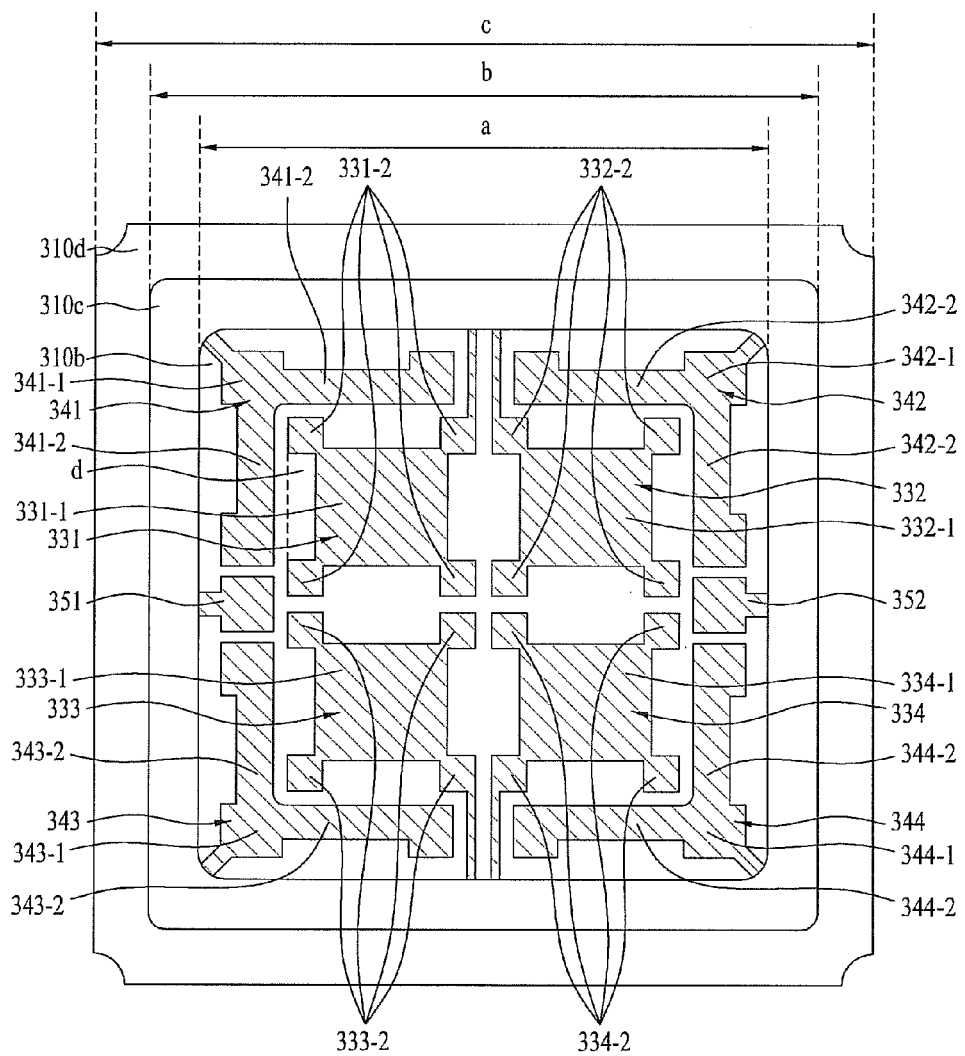
Figure 13C:
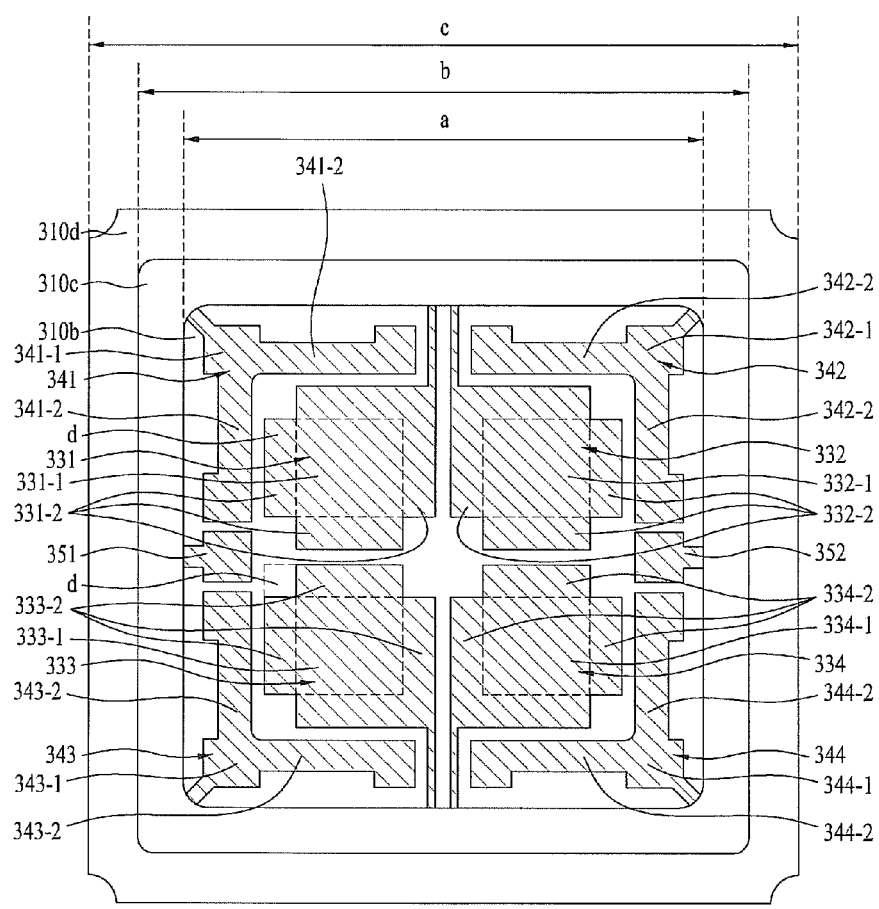
Figure 14A:
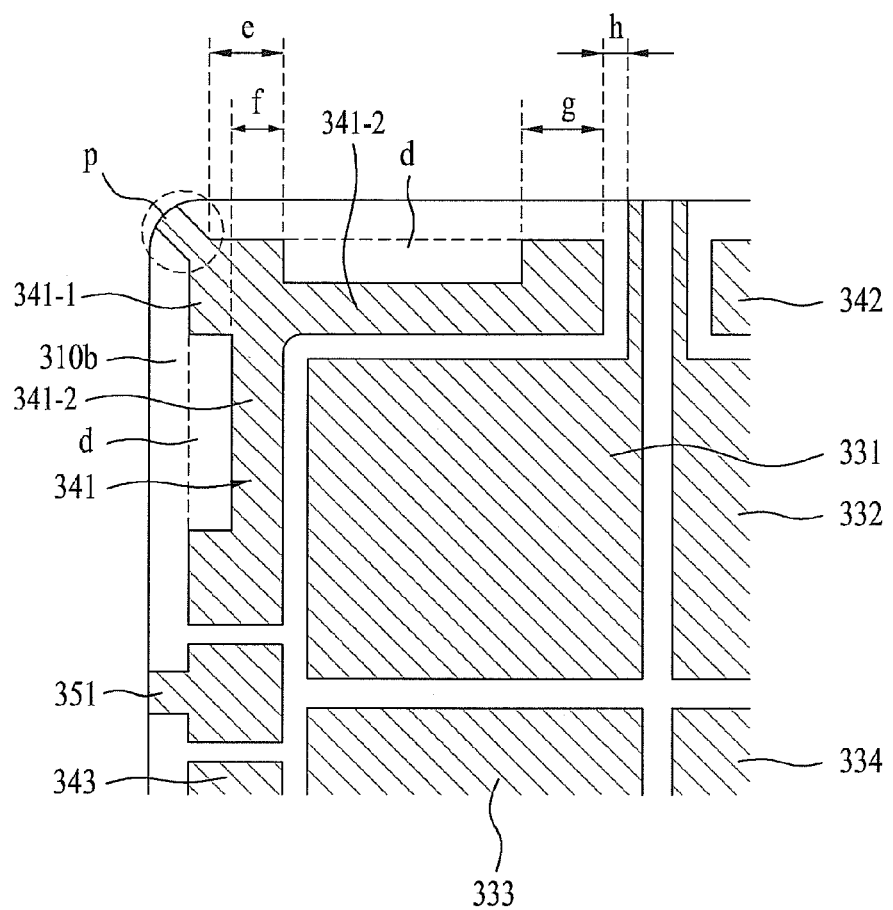
FIG. 14A is a partial detailed view of FIG. 13A.
Figure 14B:
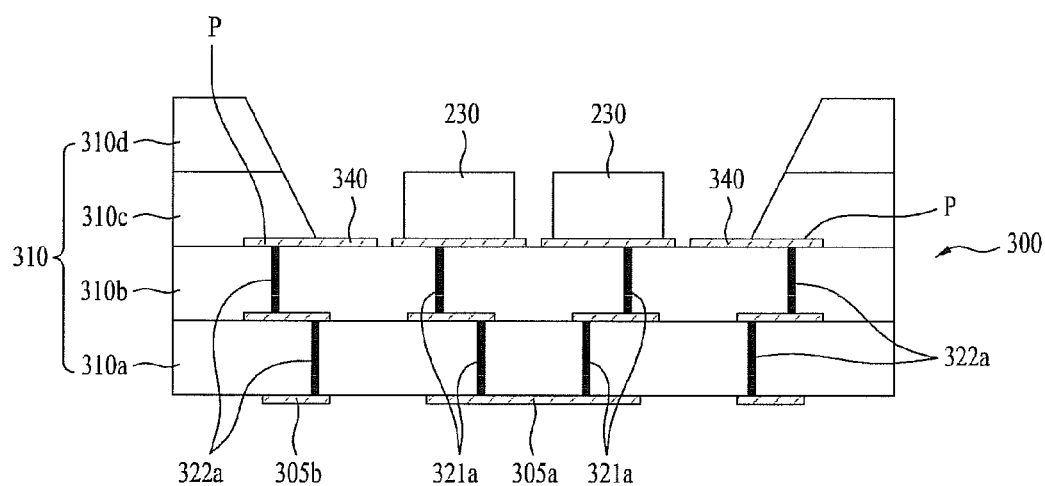
FIG. 14B is a side sectional view provided by diagonally cutting the light emitting device package of FIG. 13.

FIGS. 13A to 13C are views illustrating the arrangement of electrode patterns included in the light emitting device package of FIG. 12. Also, FIG. 14A is a partial detailed view of FIG. 13A, and FIG. 14B is a side sectional view provided by diagonally cutting the light emitting device package of FIG. 13.

Since the four light emitting devices 230 are arranged in the light emitting device package 300 of FIG. 12, as illustrated in FIG. 13A, four first electrode patterns 331, 332, 333 and 334 and four second electrode patterns 341, 342, 343 and 344 may be arranged respectively. The above described four first electrode patterns 331, 332, 333 and 334 may have the same polarity, and thus may be connected to a single lead frame. The four second electrode patterns 341, 342, 343 and 344 may have the same polarity that is different from that of the first electrode patterns 331, 332, 333 and 334, and thus may be connected to another single lead frame.

In the plan view of FIG. 13A, the ceramic layers 310c and 310d, which define the sidewall of the above described cavity, are illustrated at the periphery, and the ceramic layer 310b, which defines the bottom of the cavity, is exposed at the center. As illustrated in the plan view of FIG. 13A, the ceramic layer 310d, which is illustrated as an uppermost layer in FIG. 12, has the greatest width c, the ceramic layer 310c, which is illustrated as a second layer from top in FIG. 12, has a smaller width b than the greatest width c, and the ceramic layer 310b, which defines the bottom of the cavity, has the smallest width a.

The first electrode patterns 331, 332, 333 and 334 and the second electrode patterns 341, 342, 343 and 344 as described above may be symmetrically arranged about the center of the ceramic layer 310b that defines the bottom of the cavity. Hereinafter, an electrode pattern structure will partially be described in detail with reference to FIG. 14.

The first electrode patterns 331, 332, 333 and 334 are positioned at a central region of the bottom of the cavity, and the second electrode patterns 341, 342, 343 and 344 are positioned at an edge region of the bottom of the cavity. The above described positions of the first electrode patterns 331, 332, 333 and 334 and the second electrode patterns 341, 342, 343 and 344 may be interchanged.

The second electrode pattern 341 is shaped such that a width f of each side is smaller than a width e of a corner. The ceramic layer 310b is exposed from a region d corresponding to each side of the second electrode pattern 341 having the smaller width f as described above. That is, the second electrode pattern 341 may have different maximum and minimum widths. This arrangement ensures that light emitted from the light emitting device is reflected from an increased area of the ceramic layer 310b, which may improve light emission efficiency of the light emitting device package.

Explaining again, the second electrode pattern 341 includes a first region 341-1 and a second region 341-2 connected to the first region 341-1. A width of the first region 341-1 differs from a width of the second region 341-2, and the width e of the first region 341-1 is greater than the width of the second region 341-2. When providing the second region 341-2 with a smaller width than the width of the first region 341-1, the ceramic layer 310b is exposed outward, which may improve light reflection efficiency. The first region 341-1 is a region to which the wire 360 is bonded during wire bonding of the light emitting device 230. This is equally applied even to the other second electrode patterns 342, 343 and 344.

Also, a contact area between the exposed ceramic layer 310b and a light transmitting layer increases. Since a bonding force between the ceramic layer 310b and silicon resin contained in the light transmitting layer is greater than a bonding force between the second electrode pattern 341 formed of a metal and the light transmitting layer, the light emitting device package may achieve increased stability in an internal structure thereof.

A protrusion p may be formed at the corner of the second electrode pattern 341. The ceramic layer 310b constituting the package body is provided at a position corresponding to the protrusion p with a connection electrode of the above described via-hole type. Since the connection electrode serves to connect the second electrode pattern 341 to the lead frame, the connection electrode may be an extended pattern of the second electrode pattern 341. The protrusion p and the extended pattern as described above may be electrically connected to the through-hole formed in the package body and be electrically connected to the lead frame provided in the lower portion of the package body. Referring to FIG. 14B, the protrusion p, which is the extended pattern of the second electrode pattern 341, is extended toward the sidewall of the cavity. At least a portion of the protrusion may be located below the sidewall of the cavity. Also, the through-hole, which is electrically connected to the protrusion p, may also be arranged to vertically overlap with the sidewall of the cavity. In the case in which the electrode pattern is formed on the package body having the through-hole, the through-hole may cause a corresponding portion of the electrode pattern to be depressed, having a negative effect on reliability. Therefore, providing the through-hole and the protrusion p below the sidewall of the cavity may prevent deterioration in reliability.

Referring to FIG. 13B, the first electrode patterns 331 to 334 are patterned to define a region d corresponding to a reduced width of the electrode patterns. The ceramic layer 310b is exposed from the region d corresponding to the reduced width of the first electrode patterns 331 to 334. That is, owing to the region d corresponding to the reduced width of the first electrode patterns 331 to 334, light emitted from the light emitting device is reflected from an increased area of the ceramic layer 310b, which may improve light emission efficiency of the light emitting device package.

Explaining again, the first electrode pattern 331 includes a chip mounting region 331-1 and a plurality of edge regions 331-2 arranged around the chip mounting region 331-1. The ceramic layer 310b is exposed outward between the respective neighboring edge regions 331-2, which may improve light reflection efficiency. This is equally applied even to the other first electrode patterns 332, 333 and 334. In FIG. 13B, the edge regions 331-2 are illustrated as being located at corners of the chip mounting region 331-1 by way of example.

Referring to FIG. 13C, the first electrode patterns 331 to 334 are patterned such that corners thereof are removed to provide the first electrode patterns 331 to 334 with reduced width portions. Effects of this configuration are identical to those as described above with reference to FIG. 13B.

Explaining again, the first electrode pattern 331 includes the chip mounting region 331-1 and the plurality of edge regions 331-2 arranged around the chip mounting region 331-1. The ceramic layer 310b is exposed outward between the respective neighboring edge regions 331-2, which may improve light reflection efficiency. This is equally applied even to the other first electrode patterns 332, 333 and 334. In FIG. 13B, the edge regions 331-2 are illustrated as being located along sides of the chip mounting region 331-1 by way of example.

The above described configuration with reference to FIGS. 13A to 13C in which the electrode pattern has a reduced width portion to expose the ceramic layer may be applied to at least one of the four first electrode patterns 331 to 334 and the four second electrode patterns 341 to 344.

Referring to FIG. 14, assuming that the width f of each side of the second electrode pattern 341 is 0.35 mm, the width e of the corner may be 0.45 mm. Also, a distance h between the second electrode pattern 341 and the first electrode pattern 331 may be 0.1 mm, and a width g of a relatively wider region except for the corner may be 0.45 mm.

Figure 15:
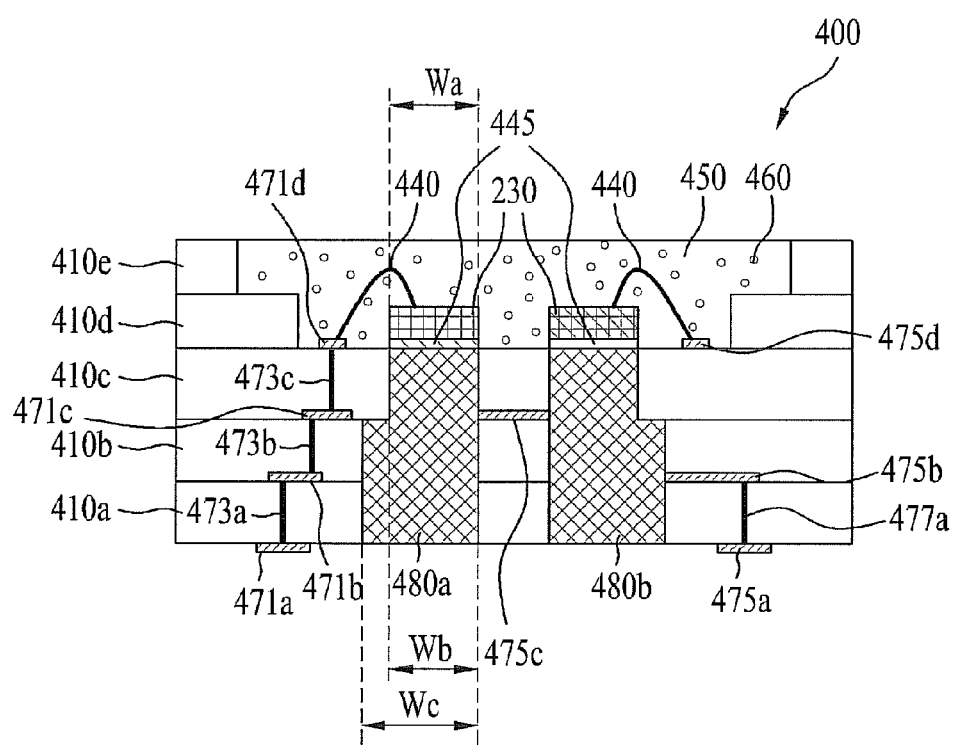
FIGS. 15 to 17 are views illustrating light emitting device packages according to a ninth embodiment.
Figure 16:
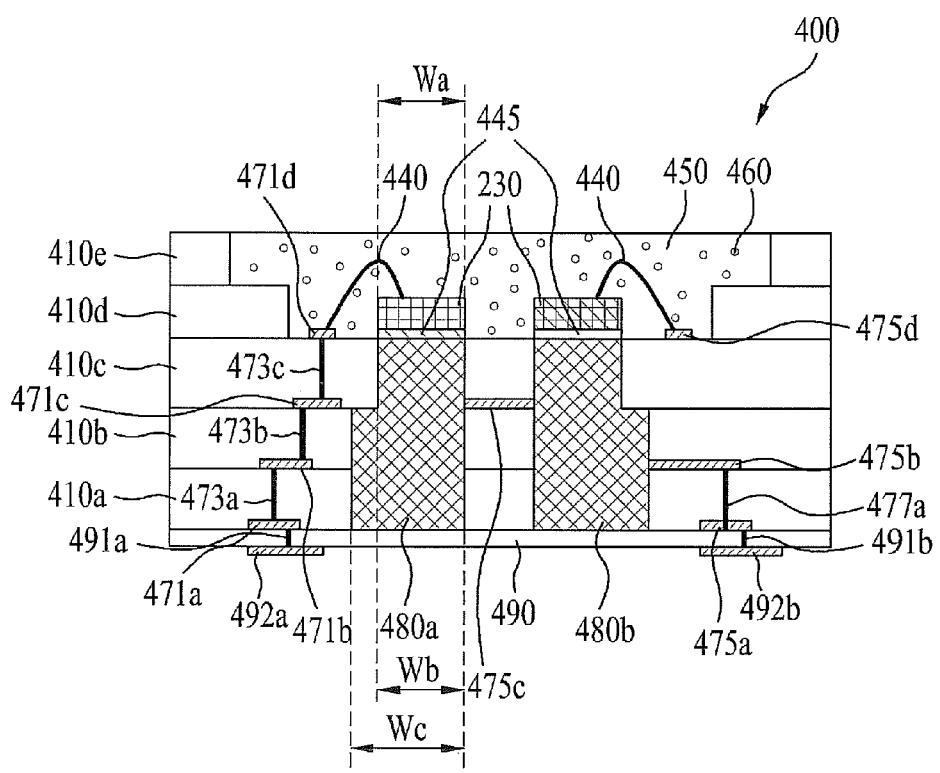
Figure 17:
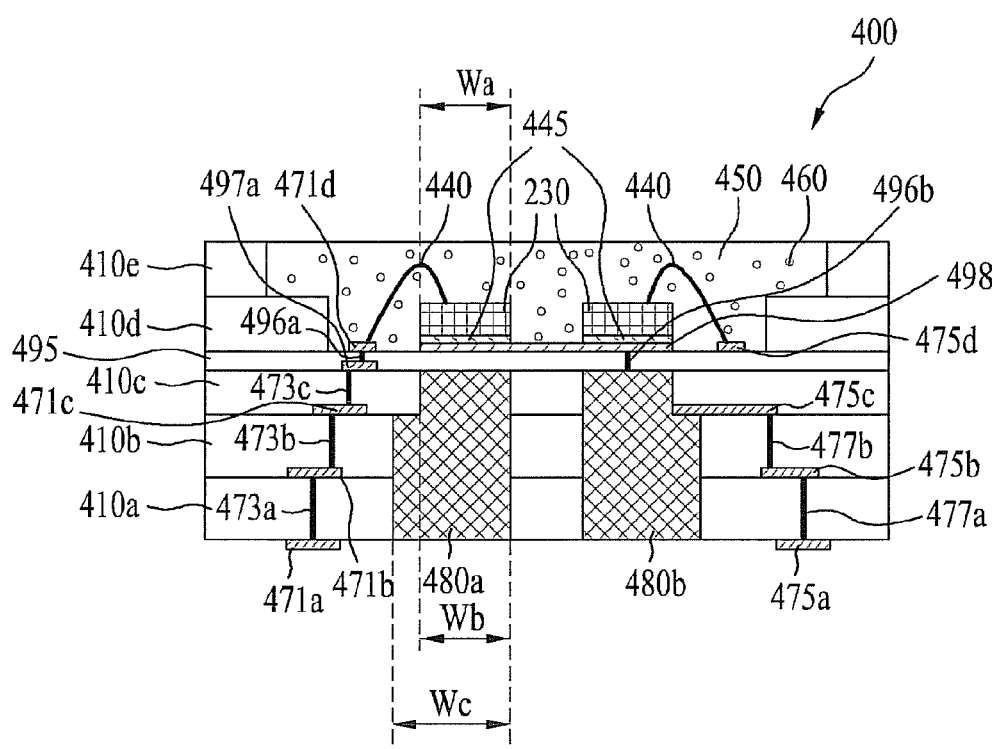

FIGS. 15 to 17 are views illustrating light emitting device packages according to a ninth embodiment. Contents overlapped with the above described embodiment will not be described again.

In the light emitting device package 400 according to the ninth embodiment, a package body includes a plurality of ceramic layers 410a, 410b, 410c, 410d and 410e. The package body may be formed using an HTCC or LTCC method.

If the package body is a multilayered ceramic substrate, the respective layers may have the same thickness or have a difference in thickness. The package body may be formed of an insulating material, such as a nitride or oxide. For example, the package body may be formed of SiO2, SixOy, Si3N4, SixNy, SiOxNy, Al2O3, or AlN.

The plurality of ceramic layers 410a, 410b, 410c, 410d and 410e may have different widths. Some layers 410a, 410b and 410c may define the bottom of the light emitting device package 400 or a cavity, and the other layers 410d and 410e may define a sidewall of the cavity.

The light emitting device 230 is disposed on the bottom of the cavity that is defined by the plurality of ceramic layers 410a, 410b, 410c, 410d and 410e as described above. In the present embodiment, at least one light emitting device may be provided. A molded part 450 may be disposed in the cavity to surround the light emitting device 230 and a wire 440. The molded part 450 may contain silicon resin or a fluorescent substance 460. The fluorescent substrate 460 serves to change a first wavelength of light emitted from the light emitting device 230 into a longer second wavelength of light. For example, if the first wavelength of light is ultraviolet light, and the second wavelength of light is visible light.

Since the package body is formed of an inorganic ceramic substrate, even if the light emitting device 230 including a deep-UV LED having a wavelength of about 260 nm to about 280 nm or a near-UV LED having a wavelength of about 365 nm to about 405 nm is used, there is no risk of the package body being discolored or deteriorated by ultraviolet light (a wavelength of about 260 nm to about 405 nm) emitted from the light emitting device 230, and it is possible to maintain reliability of a light emitting module.

Referring to FIG. 15, the light emitting device 230 is disposed on a surface of the package body. When the plurality of ceramic layers 410a, 410b, 410c, 410d and 410e constituting the package body defines the cavity, the light emitting device 230 may be disposed on a surface of the ceramic layer 410c that defines the bottom of the cavity.

In the embodiment, two light emitting devices 230 respectively come into contact with radiators 480a and 480b via conductive adhesive layers 445. The radiators 480a and 480b may be formed of a material having excellent thermal conductivity and electric conductivity, and for example, may be formed of Cu or Cu alloys. The Cu alloys may further contain at least one of W and Mo, and for example, may include Cu—W, Cu—Mo, and Cu—W—Mo. As the radiators 480a and 480b are formed of an electrically conductive material and the light emitting devices 230 are attached to the radiators 480a and 480b via the conductive adhesive layers 445, direct conduction between the light emitting devices 230 and the radiators 480a and 480b may be realized without separate wire bonding.

A portion of each radiator 480a or 480b adjacent to the corresponding light emitting device 230 may have a width Wb equal to a width Wa of the light emitting device 230, whereas a width Wc of the layer defining the bottom of the package body may be greater than the width Wa of the light emitting device 230. That is, a portion of the radiator 480a or 480b coming into contact with the light emitting device 230 has a smaller width than an opposite side portion of the light emitting device 230.

This is because it is sufficient for the radiators 480a and 480b to have the same width as the light emitting device 230 at a surface thereof coming into contact with the light emitting device 230 and increasing the width of the radiators 280a and 280b with increasing distance away from the light emitting device 230 may result in enhanced heat radiation efficiency. Moreover, when lower ends of the radiator 480a and 480b, from which heat is radiated, have a greater area, it is possible to ensure less thermal expansion of the radiators 480a and 480b than heat radiation through a small area.

Also, according to an embodiment, a width of the radiator 280a and 280b may increase with decreasing distance from the light emitting device 230.

According to an embodiment, the radiators 480a and 480b may be configured such that a first portion, which is disposed adjacent to the light emitting device 230 and has a relatively small width, and a second portion, which is disposed at an opposite side of the light emitting device 230 and has a greater width than the first portion, may be formed of different materials. For example, the first portion may be formed of an alloy layer containing Cu, and the second portion may be formed of a Cu layer. The alloy layer containing Cu may further contain at least one of W and Mo, and for example, may contain Cu—W, Cu—Mo and Cu—W—Mo.

A Cu layer has low processability, but has very excellent heat transfer properties. However, the Cu layer has a high coefficient of thermal expansion, which is considerably different from that of the light emitting device 230. Accordingly, thermal expansion and contraction stress is transmitted to the light emitting device 230 upon temperature change, which may cause damage to the light emitting device 230. To solve this problem, in the embodiment, the radiators 480a and 480b may be configured such that the lower second portion is formed of a Cu layer and the upper first portion is formed of an alloy layer containing Cu. With this configuration, the light emitting device 230 comes into contact with the alloy layer other than the Cu layer. Since a Cu—W alloy layer and a Cu—Mo alloy layer have coefficients of thermal expansion similar to that of the light emitting device 230, it is possible to prevent damage to the light emitting device 230 due to temperature change.

The two radiators 480a and 480b may be electrically connected to each other via an electrode pattern 475c that is formed on the ceramic layer 410c. The radiator 480b may be electrically connected to an electrode pattern 475b that is formed in the ceramic layer 410b, and the electrode pattern 475b may be connected to an electrode pattern 475a beneath the ceramic layer 410a via a through-hole 477a. The through-hole 477a is filled with a conductive material.

The light emitting device 230 may be bonded to an electrode pattern 471d on a surface of the ceramic layer 410c via the wire 440. The electrode pattern 471d may be connected to an electrode pattern 471a beneath the ceramic layer 410a via electrode patterns 471b and 471c and through-holes 473a, 473b and 473c which are respectively formed in the ceramic layers 410a, 410b and 410c and are filled with a conductive material. A pair of electrode patterns 471a and 475a as described above may act as electrode pads that directly electrically come into contact with a circuit board.

As illustrated, two or four light emitting devices 230 may be arranged on the above described ceramic layer 410c. The electrode patterns 471d and 475d, which are electrically connected to the respective light emitting devices 230, have the same polarity, and thus may be electrically connected to each other.

An anti-bulging layer 490 may be disposed beneath the radiators 480a and 480b. The anti-bulging layer 490 may be a green sheet, and may support the lowermost ceramic layer 410a of the package body and the radiators 480a and 480b so as to seal the radiators 480a and 480b and prevent thermal expansion of the radiators 480a and 480b.

In the embodiment illustrated in FIG. 16, the anti-bulging layer 490 is disposed beneath the ceramic layer 410a constituting the package body. The electrode pattern 471a may be electrically connected to an electrode pad 492a beneath the green sheet 490 via a through-hole 491a which is formed in the green sheet 490 and is filled with a conductive material. The electrode pattern 475a may be electrically connected to an electrode pad 492b beneath the green sheet 490 via a through-hole 491b which is formed in the green sheet 490 and is filled with a conductive material.

In the above described embodiments, the anti-bulging layer 490 may be a support plate that maintains the shape of the radiators 480a and 480b, or may be a light-transmitting thin film. The anti-bulging layer 490 may be formed of the same material as the ceramic layer 410a.

In the embodiment illustrated in FIG. 17, an anti-bulging layer 495 is disposed over the ceramic layer 410c that defines the bottom of the cavity. The light emitting device 230 may be bonded to the electrode patterns 471d and 475d on a surface of the anti-bulging layer 495 via the wire 440. The electrode pattern 471d may be electrically connected to an electrode pattern 497a via a through-hole 496a which is formed in the anti-bulging layer 495 and is filled with a conductive material. The plurality of electrode patterns 471d and 475d may be electrically connected to each other.

Two light emitting devices 230 may be electrically connected to an electrode pattern 498 formed over the ceramic layer 410c via the conductive adhesive layer 445. The electrode pattern 498 may electrically come into contact with the radiator 480b, and the radiator 480b may be electrically connected to the electrode pattern 475a beneath the ceramic layer 410a via the electrode patterns 475b and 475c and through-holes 477a and 477b that are filled with a conductive material. Also, the two radiators 480a and 480b may be electrically connected to each other.

In the present embodiment, the anti-bulging layer 495 may be disposed at a region corresponding to the radiators 480a and 480b, which may prevent the surfaces of the radiators 480a and 480b from being roughened upon thermal expansion of the radiators 480a and 480b. A portion of the anti-bulging layer 495 not corresponding to the light emitting device 230 may serve to balance the height of the package body.

Figure 18:
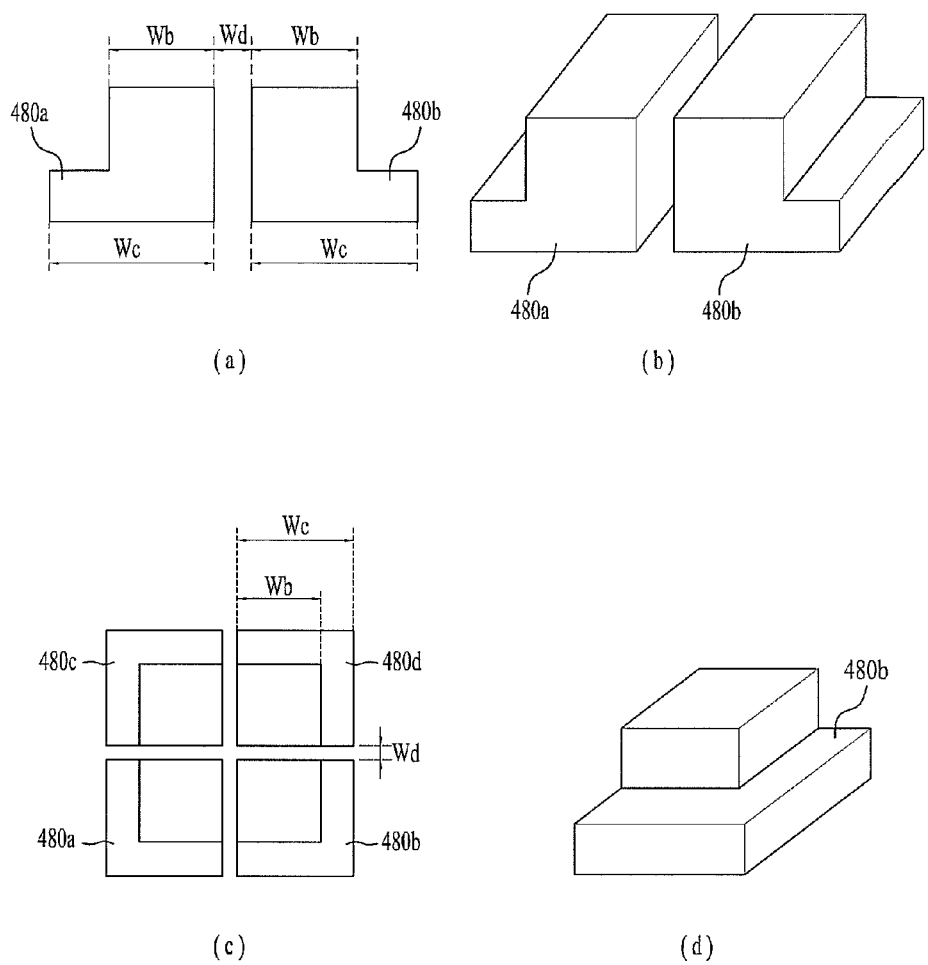
FIG. 18 is a detailed view illustrating the radiator included in the light emitting device package according to the ninth embodiment.

FIG. 18 is a detailed view illustrating the radiator included in the light emitting device package according to the ninth embodiment.

FIGS. 18(a) and 18(b) illustrate two radiators 480a and 480b, and FIGS. 18(c) and 18(d) illustrate four radiators 480a to 480d. The arrangement of the plurality of radiators may minimize thermal deformation of the radiators during fabrication of the light emitting device package, and thus may prevent tilting of the light emitting device or the light emitting device package, and consequently, achieve a balanced light emission angle.

In FIGS. 18(a) and 18(b), the width We of the lower portion of the respective radiators 480a and 480b may be greater than the width Wb of the upper portion of the radiators 480a and 480b. The respective radiators 480a and 480b are spaced apart from each other by a distance Wd. The above described distance Wd may be a width of a ceramic layer disposed between the respective radiators 480a and 480b.

In FIGS. 18(c) and 18(d), four radiators 480a, 480b, 480c and 480d may be arranged to correspond to four light emitting devices, respectively, The respective radiators 480a, 480b, 480c and 480d are spaced apart from one another by the same distance Wd, and a ceramic layer may be disposed between the respective radiators 480a, 480b, 480c and 480d. The four radiators 480a, 480b, 480c and 480d are symmetrically arranged.

Contents of the electrode pattern according to the above described eighth embodiment may be applied to the light source module according to the ninth embodiment, and a description of such overlapping contents will be omitted hereinafter.

Figure 19:
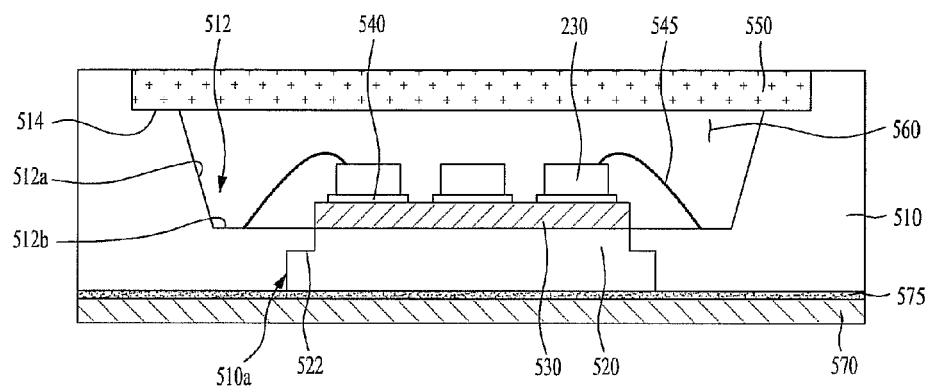
FIGS. 19 and 20 are views illustrating a light source module according to a tenth embodiment.
Figure 20:
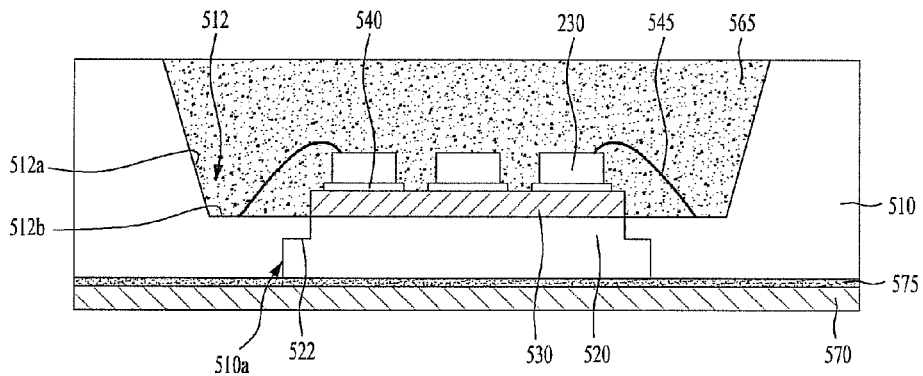

FIGS. 19 and 20 are views illustrating a light source module according to a tenth embodiment.

Referring to FIG. 19, the light source module according to the tenth embodiment includes a package body 510 having a through-hole 510a, a radiator 520 disposed in the through-hole 510a, a sub-mount 530 disposed on the radiator 520, and at least one light emitting device 230 disposed on the sub-mount 530.

The package body 510 may be a single layer ceramic substrate or a multilayered ceramic substrate. If the package body 510 is a multilayered ceramic substrate, for example, the package body 510 may be formed using a HTCC or LTCC method.

In the case of the package body 510 in the form of the multilayered ceramic substrate, the respective layers may have the same thickness or have a difference in thickness, although the disclosure is not limited thereto.

A plurality of electrode patterns may be provided in the package body 510 and be electrically connected to the light emitting device 230 to apply current required to drive the light emitting device 230.

The package body 510 may include a cavity 512 that is defined by a sidewall 512a and a bottom portion 512b. As illustrated in FIG. 19, the sidewall 512a of the package body 510 may include an inclined surface. The inclined surface may reflect light emitted from the light emitting device 230 to direct the reflected light to an open upper end of the cavity 512, which may improve light extraction efficiency of the light source module.

A reflective layer may be coated, plated or deposited on at least a part of the sidewall 512a and the bottom portion 512b of the cavity 512.

A ceramic substrate is easy to form a cavity and has high heat resistance as compared to a metal substrate that has difficulty in forming a cavity. However, in consideration of the fact that the ceramic substrate has a lower thermal conductivity than the metal substrate, to compensate for heat radiation properties, a radiator 520 formed of a metal slug may be subjected to a thermal treatment, such as co-firing or Ag—Cu bonding, prior to inserting the radiator 520 into the ceramic substrate.

In the case in which the package body 510 has the through-hole 510a and the cavity 512, the through-hole 510a may be formed in the bottom portion 512b of the cavity 512. The radiator 520 is inserted into and disposed in the through-hole 510a.

An inner surface of the through-hole 510a and an outer surface of the radiator 520, which come into contact with each other, may be provided with patterns to increase a contact area, which may increase heat radiation effects.

Although FIG. 19 illustrates the pattern as having a stepped shape by way of example, the pattern shape is not particularly limited.

The radiator 520 may be formed of a metal having excellent thermal conductivity, and for example, may be formed of at least one of Cu alloys, such as Cu—W and Cu—Mo, Cu, Mo, W, and Ag.

In consideration of coefficients of thermal expansion of the package body 510 and the radiator 520, for example, if the package body 510 is formed using HTCC technology, inserting the radiator 520 formed of Cu—W is more stable to heat. If the package body 510 is formed using LTCC technology, inserting the radiator 520 formed of Ag is more stable to heat.

The sub-mount 530 is disposed on the radiator 520. The sub-mount 530 may be a conductive substrate or an insulating substrate, and for example, may be formed of materials selected in consideration of thermal conductivity and a high coefficient of thermal expansion, such as Si, SiC, AlN and the like.

A conductive adhesive layer 540 is disposed on the sub-mount 530, and the light emitting device 230 may be attached via the conductive adhesive layer 540.

Since heat generated from the light emitting device 230 is discharged to the outside through the radiator 520 by way of the sub-mount 530, the sub-mount 530 may be formed of a material having excellent thermal conductivity.

As a result of placing the sub-mount 530 on the radiator 520, heat generated from the light emitting device 230 is discharged to the outside through the radiator 520 having excellent thermal conductivity, instead of the package body 510 having relatively low thermal conductivity, which may improve reliability of the light source module.

In the case in which the light emitting device 230 is directly mounted onto the radiator 520, the light emitting device 230 may be unintentionally separated or be unstably bonded if an upper surface of the radiator 520 is not flat, which may result in deterioration in heat radiation efficiency and reliability. This problem may be minimized by placing the light emitting device 230 on the sub-mount 530.

The radiator 520 serves to discharge heat generated from the light emitting device 230 to the outside, thereby maintaining reliability of the light source module. Thus, the light emitting device 230 and the radiator 520 may be arranged to vertically overlap with each other.

Although FIG. 19 illustrates only three light emitting devices 230 by way of example, more or fewer light emitting devices may be provided according to the embodiments.

Since the package body 510 is formed of an inorganic material, even if the light emitting device 230 including a deep-UV LED having a wavelength of about 260 nm to about 280 nm or a near-UV LED having a wavelength of about 365 nm to about 405 nm is used, there is no risk of the package body 510 being discolored or deteriorated by ultraviolet light (a wavelength of about 260 nm to about 405 nm) emitted from the light emitting device 230, and it is possible to maintain reliability of a light emitting module.

A glass part 550 may be disposed to cover the open upper end of the cavity 512 of the package body 510.

The glass part 550 may be formed of a transparent material and a non-reflective coating film, to transmit light emitted from the light emitting device 230 to the outside without absorption. For example, the glass part 550 may be formed of SiO2 (quartz, UV fused silica), Al2O3 (Sapphire), or LiF, MgF2, CaF2, low iron transparent glass, B2O3, and the like.

If the light emitting device 230 is a UV LED, the glass part 550 serves to prevent ultraviolet light emitted from the light emitting device 230 from breaking or deteriorating organic matters at the outside of the light source module.

A space 560 between the glass part 550 and the cavity 512 may be in a vacuum state, or may be filled with N2 gas or forming gas.

The package body 510 formed of a ceramic substrate may be provided at an upper end of the sidewall 512a of the cavity 512 with a support portion 514 to support the edge of the glass part 550.

Alternatively, as illustrated in FIG. 20, instead of the glass part 550, a molded part 565 may be formed in the cavity 512 of the package body 510 to surround the light emitting device 230.

The molded part 565 may be formed of high-refraction or low-refraction silicon resin mixed with a fluorescent substance, silicon resin strong to ultraviolet light, hybrid-based resin, and the like, but the disclosure is not limited thereto.

A radiating pad 570 may be disposed beneath the package body 510 and the radiator 520.

In consideration of the fact that heat generated from the light emitting device 230 is discharged to the outside by way of the sub-mount 530, the radiator 520 and the radiating pad 570, the radiating pad 570 may be formed of a material having excellent thermal conductivity. For example, the radiating pad 570 may be formed of any one metal selected from among Ag, Au and Cu.

A thermal sheet 575 may be disposed between the radiating pad 570 and the package body 510 and between the radiating pad 570 and the radiator 520. The thermal sheet 575 has excellent thermal conductivity, electric insulation and flame-resistance, and serves to assist the radiating pad 570 in coming into close contact with a heating region, thereby maximizing heat transfer effects.

Figure 21:
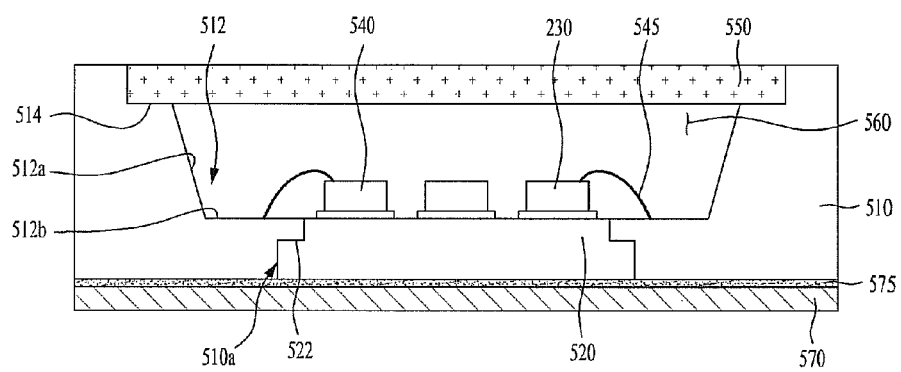
FIG. 21 is a view illustrating a light source module according to an eleventh embodiment.

FIG. 21 is a view illustrating a light source module according to an eleventh embodiment. Contents overlapped with the above described embodiment will not be described again.

The light source module according to the eleventh embodiment includes the package body 510 having the through-hole 510a, the radiator 520 disposed in the through-hole 510a, and the at least one light emitting device 230 disposed on the radiator 520.

A difference between the present embodiment and the above described tenth embodiment is that the light source module does not include the sub-mount 530 and the light emitting device 230 is directly disposed on the radiator 520.

The radiator 520 may have conductivity and the light emitting device 230 is bonded onto the conductive adhesive layer 540. Thus, direct conduction between the light emitting device 230 and the radiator 520 may be realized without separate wire bonding.

Figure 22:
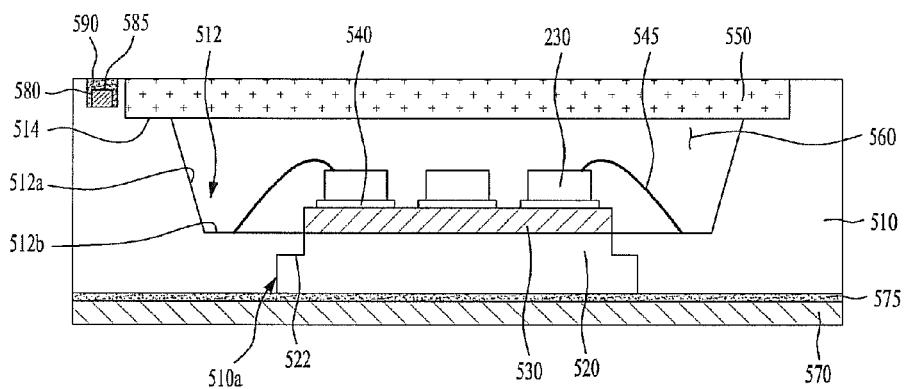
FIG. 22 is a view illustrating a light source module according to a twelfth embodiment.

FIG. 22 is a view illustrating a light source module according to a twelfth embodiment. Contents overlapped with the above described embodiment will not be described again.

In the light source module according to the twelfth embodiment, the package body 510 includes a zener diode bonding portion 580, and a zener diode 585 is disposed on the zener diode bonding portion 580.

The zener diode bonding portion 580 may be separated from a space in which the light emitting device 230 is disposed. The reason of separating or isolating the zener diode 585 from the space in which the light emitting device 230 is disposed is that light emitted from the light emitting device 230 may be absorbed, or scattered or reflected by the zener diode 585, which may deteriorate light emission efficiency of the light emitting device 230.

For example, if the package body 510 includes the cavity 512, the zener diode bonding portion 580 may be disposed at a region except for the cavity 512.

The zener diode bonding portion 580 may be provided with a molded part 590, in which, e.g., silicon resin is filled to protect the zener diode 585 and an Au wire.

Figure 23:
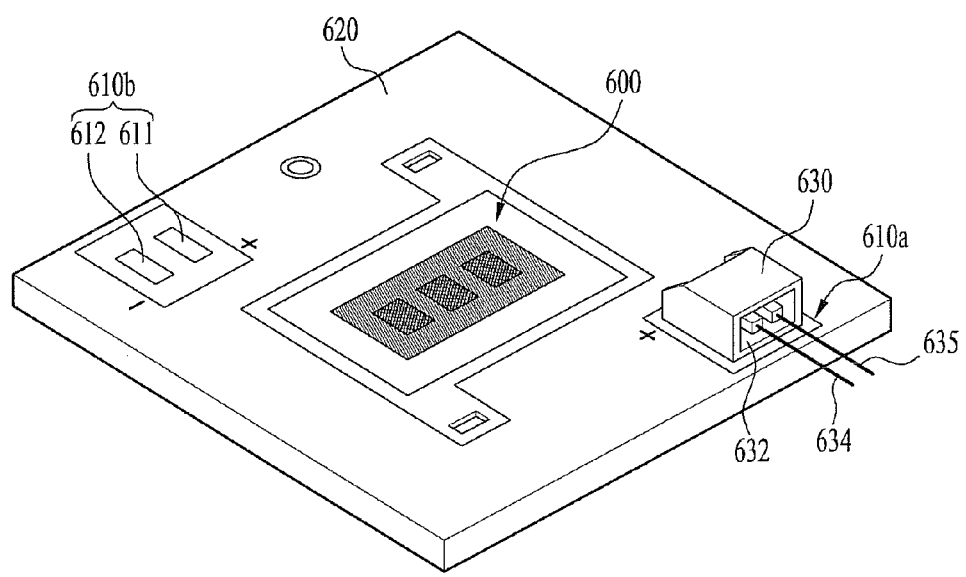
FIG. 23 is a view illustrating a light source module according to a thirteenth embodiment.

FIG. 23 is a view illustrating a light source module according to a thirteenth embodiment. Contents overlapped with the above described embodiment will not be described again.

The light source module according to the thirteenth embodiment includes a substrate 620, which includes a light source 600 disposed on a surface thereof and an electrode pad 610 electrically connected to the light source 600, and a holder 630 which is disposed on the substrate 620 and has a cavity 632 formed at a position corresponding to the electrode pad 610. The electrode pad 610 comes into contact with protruding electrodes 631 that are arranged in the cavity 632 and are electrically connected to wires 634 and 635 respectively.

The light source 600 includes a light emitting device, and may be a Chip On Board (COB) type in which the light emitting device in the form of a chip is mounted on a substrate.

The substrate 620 may be a metal substrate or a ceramic substrate, on which a circuit pattern is formed.

The ceramic substrate may be formed into a single layer or multiple layers. If the substrate 620 is a multilayered ceramic substrate, for example, the substrate 620 may be realized using HTCC or LTCC technology.

If the light emitting device is a UV LED including a deep-UV LED having a wavelength of about 260 nm to about 280 nm or a near-UV LED having a wavelength of about 365 nm to about 405 nm, the substrate 620 may be formed of a ceramic substrate so as not to be discolored or deteriorated by ultraviolet light (a wavelength of about 260 nm to about 405 nm) emitted from the light emitting device.

The electrode pad 610 electrically connected to the light source 600 is disposed at an upper surface of the substrate 620.

The electrode pads 610 may include a plurality of electrode pads 610 according to the embodiments.

Although the electrode pad 610 may be disposed adjacent to the edge of the substrate 620, the position of the electrode pad 610 may be changed according to the embodiments, and the disclosure is not limited thereto.

The electrode pad 610 may be directly disposed on the upper surface of the substrate 620, or may be disposed in a recess 614 formed in the substrate 620.

More specifically, a thickness of a portion of the substrate 620 corresponding to the electrode pad 610 may be different from a thickness of the remaining portion of the substrate 620 not corresponding to the electrode 610. For example, the portion of the substrate 620 corresponding to the electrode pad 610 may have a smaller thickness.

The electrode pad 610 includes an anode electrode pad 611 which is electrically connected to a first electrode of the light source 600, and a cathode electrode pad 612 which is spaced apart from the anode electrode pad 611 and is electrically connected to a second electrode of the light source 600.

The anode electrode pad 611 and the cathode electrode pad 612 may be arranged parallel to each other in the same direction, but the disclosure is not limited thereto.

Although FIG. 23 illustrates the light source module as having two electrode pads 610, i.e. a first electrode pad 610a and a second electrode pad 610b by way of example, a light source module having only one electrode pad or three or more electrode pads may be possible according to the embodiments.

If two or more electrode pads 610 are provided, it is possible to select and use any one of the electrode pads 610 disposed at a convenient position without changing the position or direction of the light source module based on a position of an external power source.

The holder 630 is disposed on the substrate 620 and includes the cavity 632 corresponding to the electrode pad 610. The wires 634 and 635 arranged in the cavity 632 come into contact with the electrode pad 610.

More specifically, the wires 634 and 635 connected to the external power source are arranged in the cavity 632 of the holder 630, and the protruding electrodes 631 electrically connected to the wires 634 and 635 come into contact with the anode electrode pad 611 and the cathode electrode pad 612, respectively, to apply current to the light source module.

The internal configuration of the holder 630 and the contact configuration between the holder 630 and the electrode pad 610 will be described hereinafter with reference to FIGS. 25 and 26.

If the light emitting device includes a UV LED, the holder 630 may be formed of an inorganic material so as not to be discolored or deteriorated by ultraviolet light emitted from the light emitting device.

Although FIG. 23 illustrates the holder 630 as being provided only on the first electrode pad 610a for easy explanation of the shape of the electrode pad 610, the holder 630 is also provided on the second electrode pad 610b.

Figure 24:
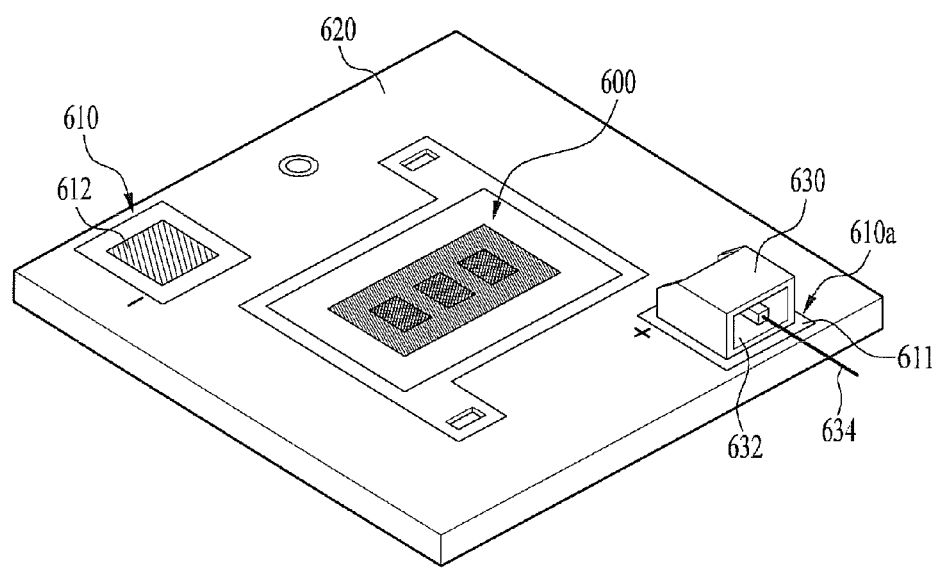
FIG. 24 is a view illustrating a light source module according to a fourteenth embodiment.

FIG. 24 is a view illustrating a light source module according to a fourteenth embodiment. Contents overlapped with the above described embodiment will not be described again.

The light source module according to the fourteenth embodiment includes the substrate 620, which includes the light source 600 disposed on the surface thereof and the electrode pad 610 electrically connected to the light source 600, and the holder 630 which is disposed on the substrate 620 and has the cavity 632 formed at a position corresponding to the electrode pad 610. The electrode pad 610 comes into contact with the protruding electrode 631 that is arranged in the cavity 632 and is electrically connected to the wire 634.

The light source 600 includes a light emitting device, and may be a Chip On Board (COB) type in which the light emitting device in the form of a chip is mounted on a substrate.

The electrode pad 610 includes the anode electrode pad 611 which is electrically connected to the first electrode of the light source 600, and the cathode electrode pad 612 which is spaced apart from the anode electrode pad 611 and is electrically connected to the second electrode of the light source 600.

In this case, differently from the above described thirteenth embodiment, the anode electrode pad 611 and the cathode electrode pad 612 are not arranged parallel to each other in the same direction, but are arranged respectively at different regions of the substrate 620.

FIG. 24 illustrates the anode electrode pad 611 as being disposed at a partial edge region of the substrate 620 and the cathode electrode pad 612 as being disposed at a remote position diagonally spaced apart from the anode electrode pad 611.

Also, differently from the above described thirteenth embodiment, the anode electrode pad 611 and the cathode electrode pad 612 are remotely spaced apart from each other, and therefore the holder 630 is also divided to cover the anode electrode pad 611 and the cathode electrode pad 612 respectively. Thus, a single wire connected to the external power source is disposed in the cavity 632 formed in each holder 630.

More specifically, a difference between the holder 630 of the thirteenth embodiment and the holder 630 of the fourteenth embodiment is that the holder 630 of the thirteenth embodiment is a single holder to cover both the anode electrode pad 611 and the cathode electrode pad 612, and thus the two wires 634 and 635 having different polarities are arranged in the cavity 632, whereas the holder 630 of the fourteenth embodiment includes one holder to cover the anode electrode pad 611 and the other holder to cover the cathode electrode pad 612, and thus the wires 634 and 635 having different polarities are arranged respectively in the cavities 632 of the two holders.

FIG. 24 illustrates the holder 630 as being disposed only on the anode electrode pad 611 for easy explanation of the shape of the electrode pad 610, the holder 630 is also provided on the second electrode pad 612.

Figure 25:
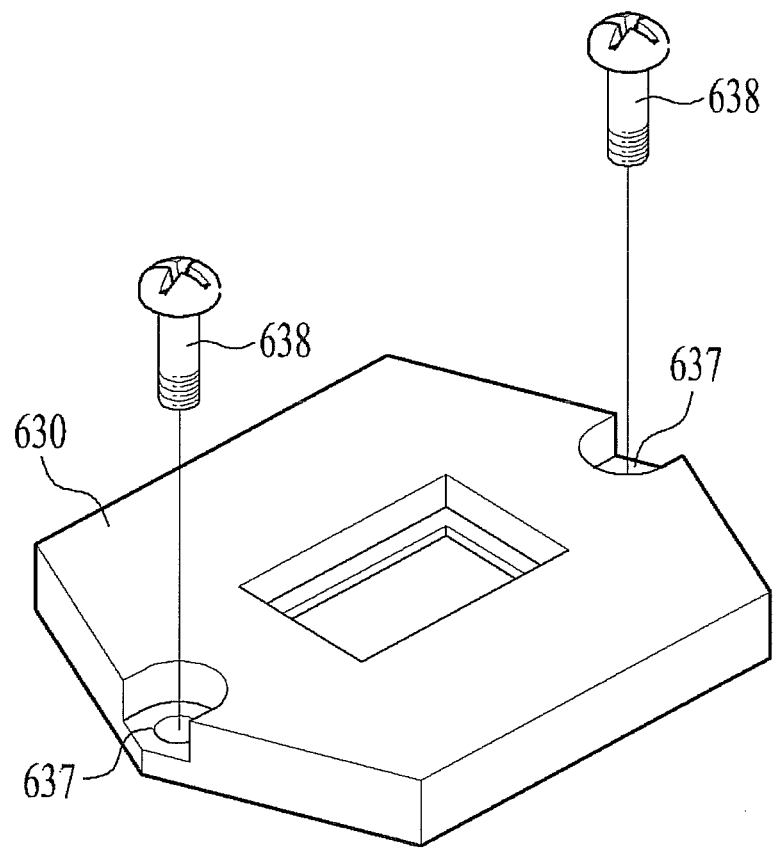
FIG. 25 is a view illustrating a holder fastening configuration.

FIG. 25 is a view illustrating a holder fastening configuration. Hereinafter, a fastening structure of the holder 630 disposed in the light source module according to the embodiment will be described with reference to FIG. 25.

FIG. 25 illustrates only a lower surface of the holder 630 except for an upper surface thereof. The holder 630 includes at least one first fastening portion 637, and may be fixed to the substrate 620 that is disposed at the lower surface of the holder 630 using a fastener 638.

Although not illustrated, the substrate 620 may be provided with a fastening portion at a position corresponding to the first fastening portion 637.

In FIG. 25, the fastening portion 637 may include two through-holes formed in the lower surface of the holder 630 by way of example, and the fastener 638 may include a screw fastened through the fastening portion 637 of the holder 630 and the fastening portion of the substrate 620 to fix the holder 630 to the substrate 620.

The shape and number of the first fastening portion 637 and the kind of the fastener 638 may be changed in various ways according to the embodiments and are not particularly limited.

Figure 26A:
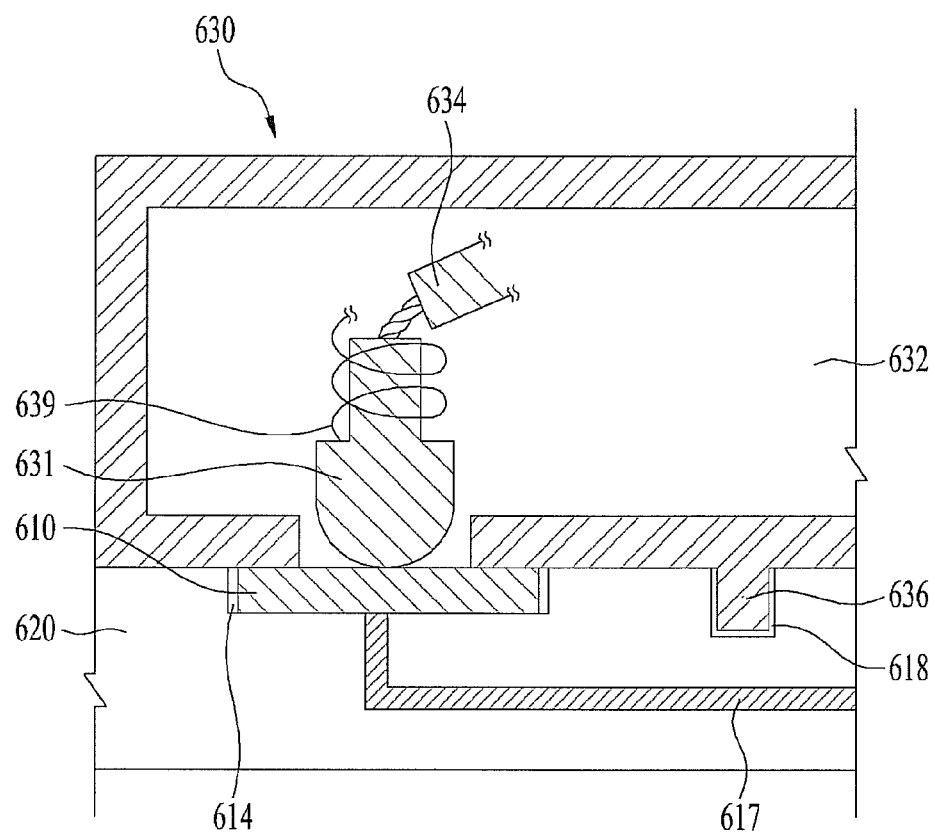
FIGS. 26A and 26B are sectional views illustrating an embodiment of a contact structure between a wire disposed in a holder and an electrode pad on a substrate.
Figure 26B:
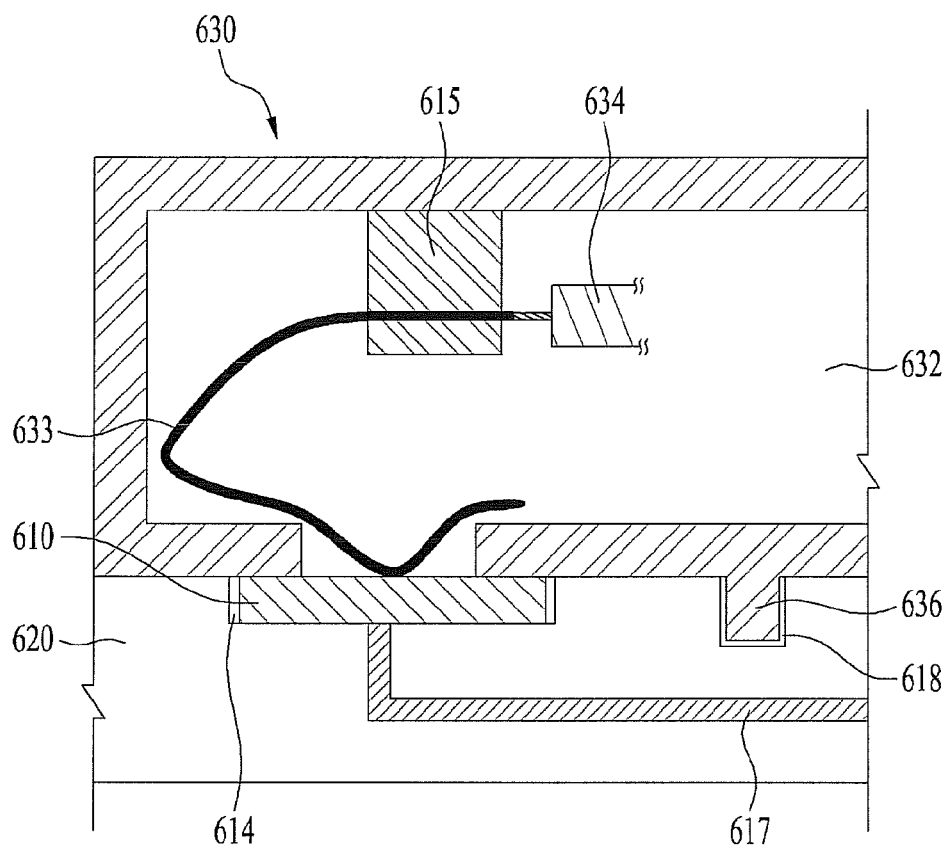

FIGS. 26A and 26B are sectional views illustrating an embodiment of a contact configuration between the wire disposed in the holder and the electrode pad on the substrate.

Referring to FIG. 26A, the holder 630 has the cavity 632 at a position corresponding to the electrode pad 610 on the substrate 620, and the protruding electrode 631 electrically connected to the wire 634 is disposed in the cavity 632 so as to come into contact with the electrode pad 610.

The substrate 620 is provided with the recess 614 and the electrode pad 610 may be disposed in the recess 614.

The electrode pad 610 is connected to a circuit pattern 617 formed in the substrate 620.

Although the wire 634 connected to the external power source and the electrode pad 610 on the substrate 620 have been electrically connected to each other by soldering in the related art, soldering may cause environmental contamination due to use of heavy metals, such as lead, and consequently cause a wire connection failure due to cold soldering.

According to the embodiment, the wire 634 disposed in the holder 630 mechanically comes into contact with the electrode pad 610 via the protruding electrode 631. This contact configuration causes no environmental contamination and minimizes a wire connection failure, resulting in improved reliability of a light emitting module.

A spring 639 to support the protruding electrode 631 may be provided in the cavity 632 of the holder 630.

When the wire 634 comes into contact with the electrode pad 610 via the protruding electrode 631, the spring 639 assists the protruding electrode 631 in more firmly coming into contact with the electrode pad 610 by elasticity thereof.

An outer surface of the spring 639 is coated with an insulating material to prevent short-circuiting between the wire 634 and the electrode pad 610.

Alternatively, as illustrated in FIG. 26B, the wire 634 and the electrode pad 610 may be electrically connected to each other via a second electrode 633. Here, the second electrode 633 is an integral unit of the spring 639 and the protruding electrode 631 of FIG. 26A.

In this case, a support portion 615 is formed at a surface of the cavity 632 such that one side of the second electrode 633 penetrates through the support portion 615 to thereby be supported by the support portion 615.

The holder 630 includes at least one protrusion 636 formed at a lower surface thereof facing the substrate 620, and the substrate 620 has at least one receiving recess 618 formed at a position corresponding to the protrusion 636. The holder 630 may be fitted into the substrate 620 via engagement between the protrusion 636 and the receiving recess 618.

The protrusion 636 and the receiving groove 618, as described above in relation to FIG. 25, assist the holder 630 and the substrate 620 in more firmly being coupled to each other, along with the fastener 638.

Although FIGS. 26A and 26B illustrate the wire 634 electrically connected to the anode electrode pad 611 by way of example, the above description may be equally applied, even to the wire 635 electrically connected to the cathode electrode pad 612.

Also, although not illustrated, if the single holder 630 is disposed to cover both the anode electrode pad 611 and the cathode electrode pad 612 as illustrated in FIG. 23, the two wires 634 and 635 having different polarities are disposed in the cavity 632 of the holder 630. The wires 634 and 635 may be electrically connected to the anode electrode pad 611 and the cathode electrode pad 612 arranged on the substrate 620 respectively.

Figure 27:
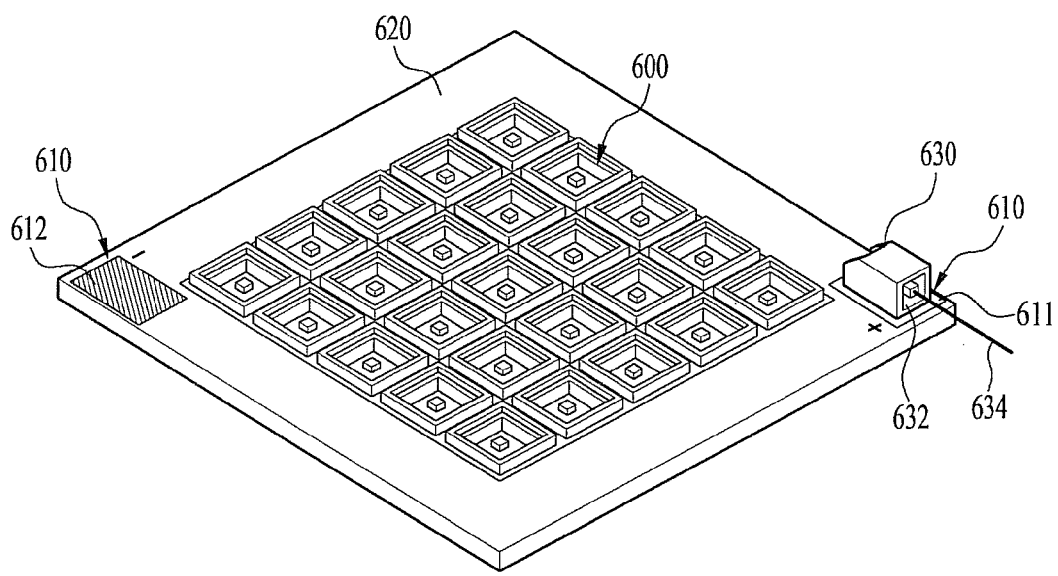
FIG. 27 is a view illustrating a light source module according to a fifteenth embodiment.

FIG. 27 is a view illustrating a light source module according to a fifteenth embodiment. Contents overlapped with the above described embodiment will not be described again.

The light source module according to the fifteenth embodiment includes the substrate 620, which includes the light source 600 disposed on the surface thereof and the electrode pad 610 electrically connected to the light source 600, and the holder 630 which is disposed on the substrate 620 and has the cavity 632 formed at a position corresponding to the electrode pad 610. The electrode pad 610 comes into contact with the protruding electrode 631 that is arranged in the cavity 632 and is electrically connected to the wire 634.

The light source 600 includes a light emitting device package, and may be a Package On Board (POB) type in which a light emitting device package is mounted on a substrate.

The electrode pad 610 is disposed on the upper surface of the substrate 620, and includes the anode electrode pad 611 which is electrically connected to the first electrode of the light source 600, and the cathode electrode pad 612 which is spaced apart from the anode electrode pad 611 and is electrically connected to the second electrode of the light source 600.

As described above, although the number and positions of the electrode pads 610 and the number and positions of the anode electrode pads 611 and the cathode electrode pads 612 included in the electrode pads 610 may be changed in various ways, FIG. 27 illustrates the single anode electrode pad 611 as being disposed at a partial edge region of the substrate 620 and the single cathode electrode pad 612 as being remotely spaced apart from the anode electrode pad 611 by way of example.

Also, the holders 630 are respectively positioned to correspond to the anode electrode pad 611 and the cathode electrode pad 612 so as to cover the anode electrode pad 611 and the cathode electrode pad 612.

The holders 630 are similar to the above description in relation to the thirteenth and fourteenth embodiments, and thus a detailed description thereof will be omitted.

Although FIG. 27 illustrates the holder 630 as being disposed only on the anode electrode pad 611 for easy explanation of the shape of the electrode pad 610, the holder 630 is also disposed on the cathode electrode pad 612.

The substrate 620 may be a metal plate or ceramic plate provided with a circuit pattern.

The ceramic substrate may be formed into a single layer or multiple layers. If the substrate 620 is a multilayered ceramic substrate, for example, the substrate 620 may be realized using HTCC or LTCC technology.

Figure 28:
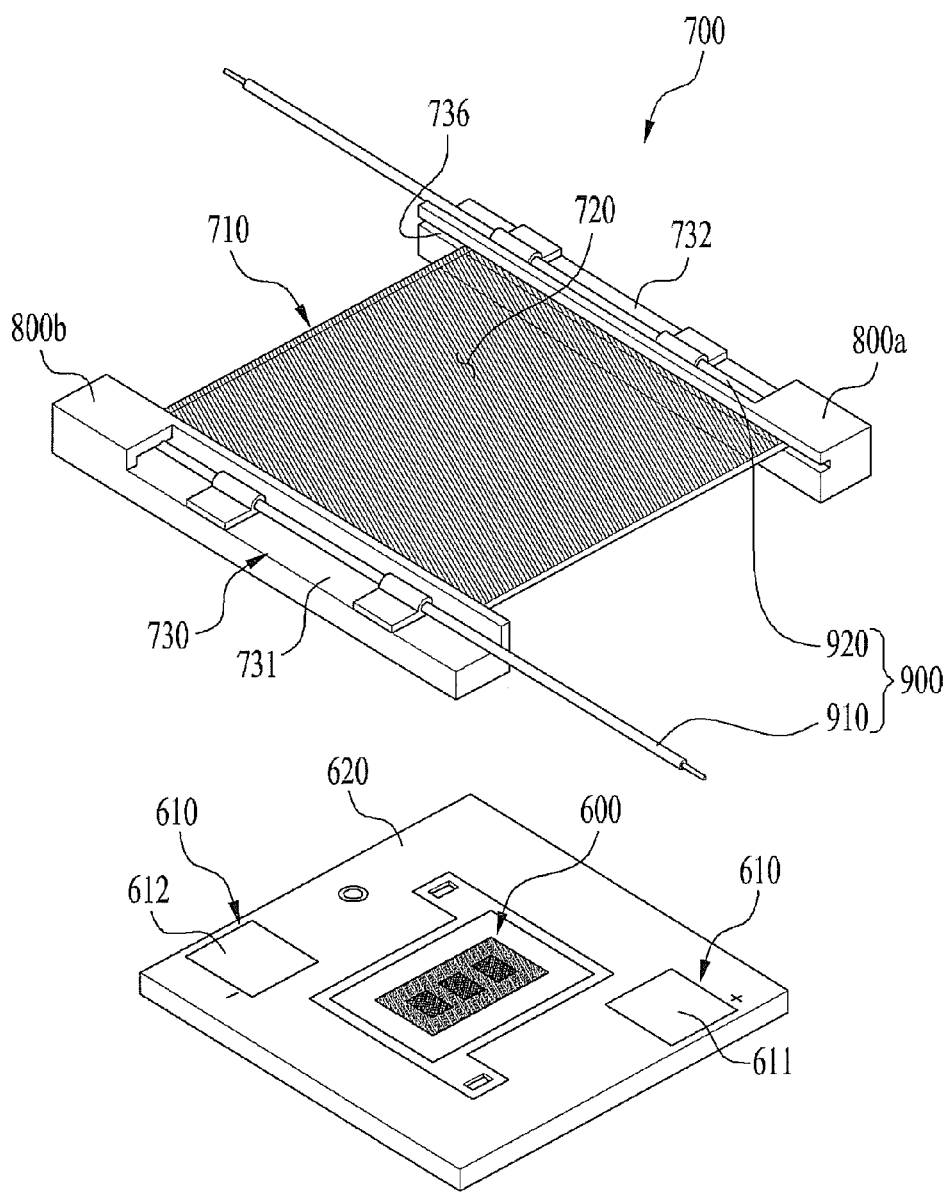
FIG. 28 is a view illustrating a light source module according to a sixteenth embodiment.

FIG. 28 is a view illustrating a light source module according to a sixteenth embodiment. Contents overlapped with the above described embodiment will not be described again.

The light source module according to the sixteenth embodiment includes the substrate 620, which includes the light source 600 disposed on the surface thereof and the electrode pad 610 electrically connected to the light source 600, a holder 700, which is disposed on the substrate 620 and has an opening 710 corresponding to the light source 600, and a diffusion member 720, which is fixed in the opening 710 so as to be disposed on the light source 600.

The light source 600 includes a light emitting device, and may be a Chip On Board (COB) type in which the light emitting device in the form of a chip is mounted on the substrate 620.

The substrate 620 may be a metal plate or ceramic plate provided with a circuit pattern.

The ceramic substrate may be formed into a single layer or multiple layers. If the substrate 620 is a multilayered ceramic substrate, for example, the substrate 620 may be realized using HTCC or LTCC technology.

The holder 700 may include a support plate 730, which is positioned to correspond to at least a partial edge region of the substrate 620, and at least one cover unit 800 having a cavity corresponding to the electrode pad 610.

Referring to FIG. 28, the support plate 730 may include a first support plate 731, which is positioned to correspond to one of four edge regions of the substrate 620, and a second support plate 732, which is disposed to face the first support plate 731.

In this case, inner surfaces of the first support plate 731 and the second support plate 732 define the opening 710.

An inner circumferential surface of the opening 710, i.e. the inner surfaces of the first support plate 731 and the second support plate 732 are provided with insertion grooves 736, such that the diffusion member 720 is inserted into and coupled to the insertion grooves 736.

As described above, although the support plate 730 may be positioned to correspond to at least a partial edge region of the substrate 620, the support plate 730 may be symmetrically positioned, in consideration of the fact that the inner surface of the support plate 730 defines the opening 710 and the diffusion member 720 is coupled to the insertion groove 736 formed at the inner surface of the opening 710.

The support plate 730 may come into contact with the upper surface of the substrate 620 at the edge region of the substrate 620.

The cover unit 800 is disposed on the substrate 620 to cover the electrode pad 610 disposed on the substrate 620.

Although FIG. 28 illustrates two first and second cover units 800*a* and 800*b* by way of example, more or fewer cover units may be provided according to the number or positions of the electrode pads 610.

The cover unit 800 may include the plurality of cover units 800*a* and 800*b* according to the embodiments.

Although not illustrated, for example, if the anode electrode pad 611 and the cathode electrode pad 612 are arranged in parallel and adjacent to each other, only a single cover unit 800 configured to cover both the anode electrode pad 611 and the cathode electrode pad 612 may be provided.

Alternatively, for example, if two or more anode and cathode electrode pads 611 and 612 are arranged in parallel and adjacent to each other, two or more cover units 800 may be provided.

In FIG. 28, the anode electrode pad 611 is disposed on at least a partial edge region of the substrate 620 and the cathode electrode pad 612 is remotely spaced apart from the anode electrode pad 611. Thus, the first cover unit 800*a* to cover the anode electrode pad 611 and the second cover unit 800*b* to cover the cathode electrode pad 612 are respectively provided.

Although the cover unit 800 and the support plate 730 may be individually formed, and thereafter be coupled to each other, they may be integrally formed with each other as illustrated in FIG. 28.

Figure 29A:
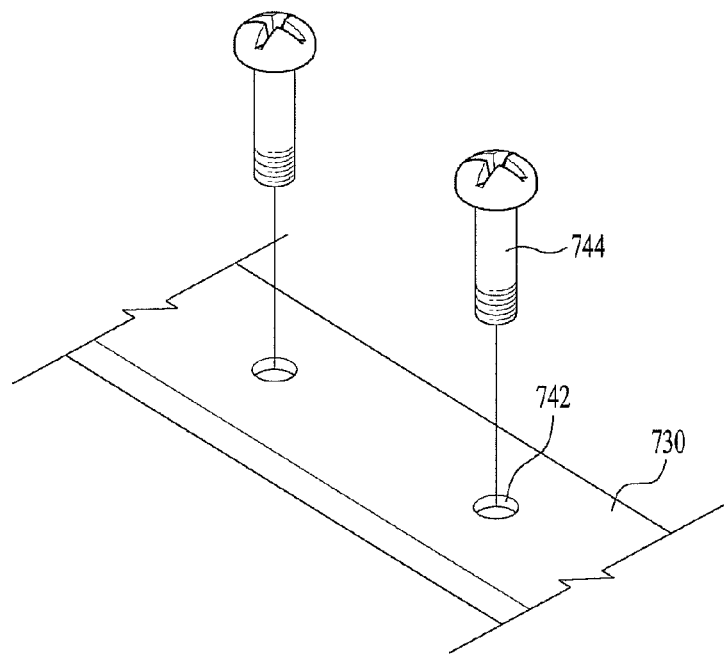
FIG. 29A is a partial perspective view of a support plate when viewed from the top.
Figure 29B:
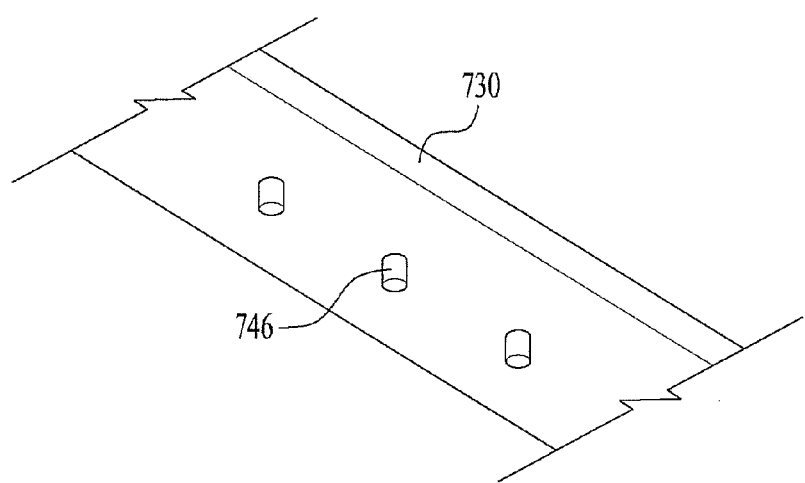
FIG. 29B is a partial perspective view of the support plate when viewed from the bottom.

FIG. 29A is a partial perspective view of the support plate when viewed from the top, and FIG. 29B is a partial perspective view of the support plate when viewed from the bottom.

Referring to FIG. 29A, the support plate 730 may be provided with at least one first fastening portion 742, and a fastener 744 to be fastened into the first fastening portion 742 may be provided.

FIG. 29A illustrates the first fastening portion 742 in the form of a through-hole and the fastener 744 in the form of a screw by way of example, but the disclosure is not limited thereto.

Although not illustrated, the substrate 620 may be provided at a region thereof corresponding to the first fastening portion 742 with a fastening portion, such that the holder 700 may be fixed to the substrate 620 by the fastener 744.

The shape and number of the first fastening portions 742 and the kind of the fastener 744 may be changed in various ways, and are not particularly limited.

Referring to FIG. 29B, the support plate 730 may be provided with at least one protrusion 746 at a surface thereof facing the substrate 620.

Although not illustrated, a receiving recess may be formed in a region of the substrate 620 corresponding to the protrusion 746, such that the holder 700 may be fixed to the substrate 620 as the protrusion 746 is fitted into the receiving recess.

The shape, number and positions of the protrusions 746 may be changed in various ways, and are not particularly limited.

Referring again to FIG. 28, the inner circumferential surface of the opening 710, i.e. the inner surfaces of the first support plate 731 and the second support plate 732 are provided with insertion grooves 736, such that the diffusion member 720 is inserted into and coupled to the insertion grooves 736.

The diffusion member 720 serves to expand a light incidence angle to the maximum extent by refracting and scattering light directed from the light source 600, which may ensure uniform diffusion of light.

The diffusion member 720 may be formed of a transparent material that transmits light emitted from the light source 600 without absorption, so as to improve light extraction efficiency of a light emitting module.

If the light source 600 includes a UV LED, the diffusion member 720 may be formed of an inorganic material, and for example, may be formed of a glass material or a light transmitting resin material, to prevent the diffusion member 720 from being discolored or deteriorated by light emitted from the light source 600.

Additionally, a light extraction pattern or a pattern for intercepting light having a selected wavelength may be disposed on a surface of the diffusion member 720.

The light extraction pattern may improve light extraction efficiency via scattered reflection of light generated from the light source 600. The light extraction pattern may be periodically or non-periodically formed, and for example, may be of a Micro Lens Array (MLA) type.

The pattern for intercepting light having a selected wavelength may serve as a color filter, and may selectively transmit only light within a selected wavelength band among various wavelength bands of light generated from the light source 600.

Although not illustrated, a first prism sheet, a second prism sheet, and a protective sheet may be inserted into the insertion grooves 736 so as to be disposed above the diffusion member 720. The placement sequence of these sheets may be changed.

The first prism sheet may include a support film, and a polymeric material formed on a surface of the support film, the polymeric material having light transmittance and elasticity. The polymer material may include a prism layer in which a plurality of 3-dimensional structures is repeatedly formed. The first prism sheet may have a stripe pattern in which ridges and valleys are repeatedly formed.

Ridges and valleys of the second prism sheet may be arranged orthogonally to the ridges and valleys on the surface of the support film of the first prism sheet.

Figure 30:
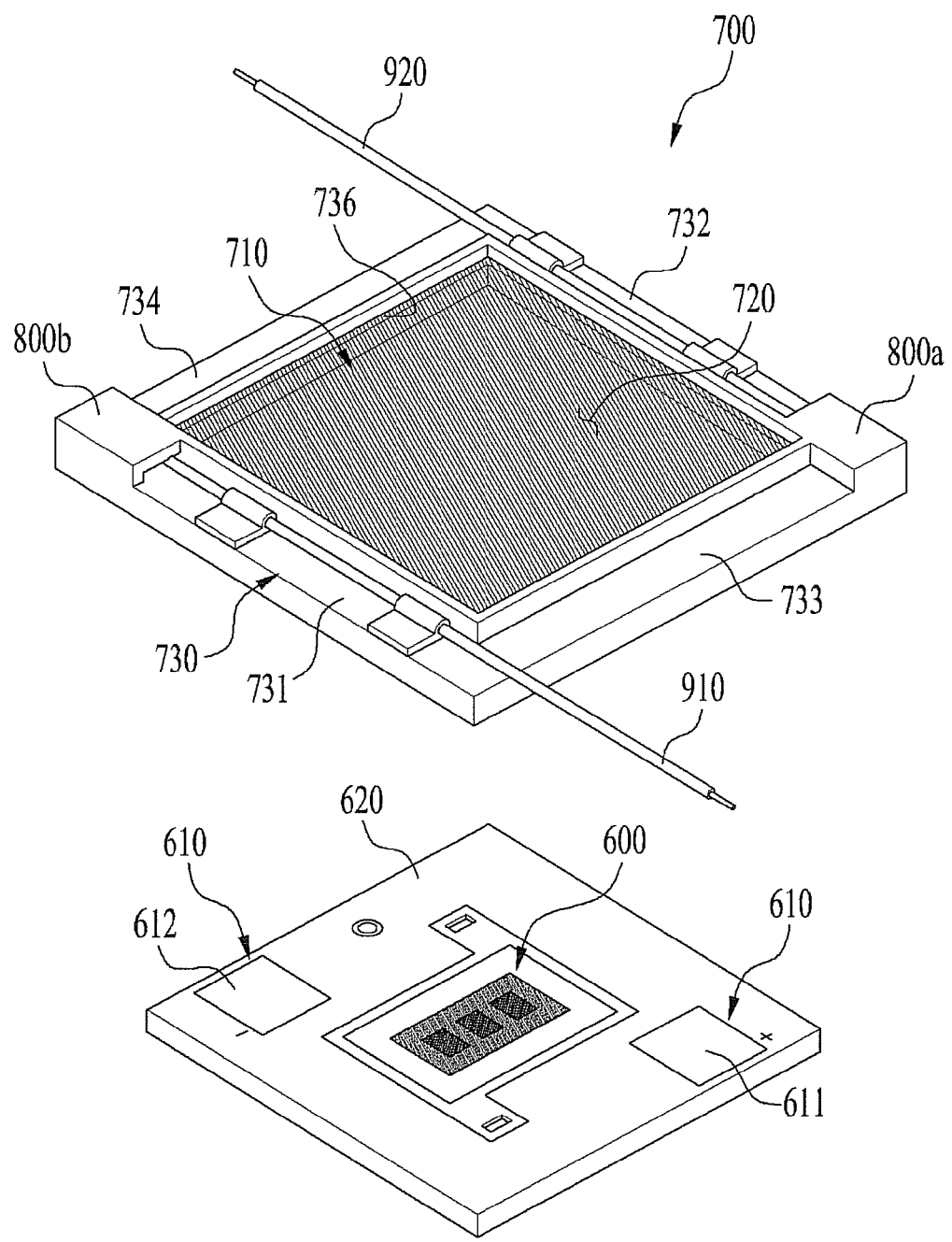
FIG. 30 is a view illustrating a light source module according to a seventeenth embodiment.

FIG. 30 is a view illustrating a light source module according to a seventeenth embodiment. Contents overlapped with the above described embodiment will not be described again.

The light source module according to the seventeenth embodiment includes the substrate 620, which includes the light source 600 disposed on the surface thereof and the electrode pad 610 electrically connected to the light source 600, the holder 700, which is disposed on the substrate 620 and has the opening 710 corresponding to the light source 600, and the diffusion member 720, which is fixed in the opening 710 so as to be disposed on the light source 600.

The light source 600 includes a light emitting device, and may be a Chip On Board (COB) type in which the light emitting device in the form of a chip is mounted on the substrate 620.

The holder 700 may include the support plate 730, which is positioned to correspond to at least a partial edge region of the substrate 620, and the at least one cover unit 800 having a cavity corresponding to the electrode pad 610.

Referring to FIG. 30, the support plate 730 may include the first support plate 731, which is disposed to correspond to one of four edge regions of the substrate 620, the second support plate 732, which is disposed to face the first support plate 731, a third support plate 733, which connects one end of the first support plate 731 and one end of the second support plate 732 to each other, and a fourth support plate 734, which is disposed to face the third support plate 733 and connects the other end of the first support plate 731 and the other end of the second support plate 732 to each other.

In this case, inner surfaces of the first, second, third and fourth support plates 731 to 734 define the opening 710.

Configurations of the third support plate 733 and the fourth support plate 734 are identical to the above described configurations of the first and second support plates 731 and 732, and thus a detailed description thereof will be omitted.

The inner circumferential surface of the opening 710, i.e. the inner surfaces of the first, second, third and fourth support plates 731 to 734 may be provided with the insertion grooves 736, and the diffusion member 720 may be inserted into and coupled in the insertion grooves 736.

The diffusion member 720 serves to expand a light incidence angle to the maximum extent by refracting and scattering light directed from the light source 600, which may ensure uniform diffusion of light.

The diffusion member 720 may be formed of a transparent material that transmits light emitted from the light source 600 without absorption, so as to improve light extraction efficiency of a light emitting module.

If the light source 600 includes a UV LED, the diffusion member 720 may be formed of an inorganic material, and for example, may be formed of a glass material, to prevent the diffusion member 720 from being discolored or deteriorated by light emitted from the light source 600.

The cover unit 800 and the first to fourth support plates 731 to 734 may be integrally formed with each other.

Figure 31:
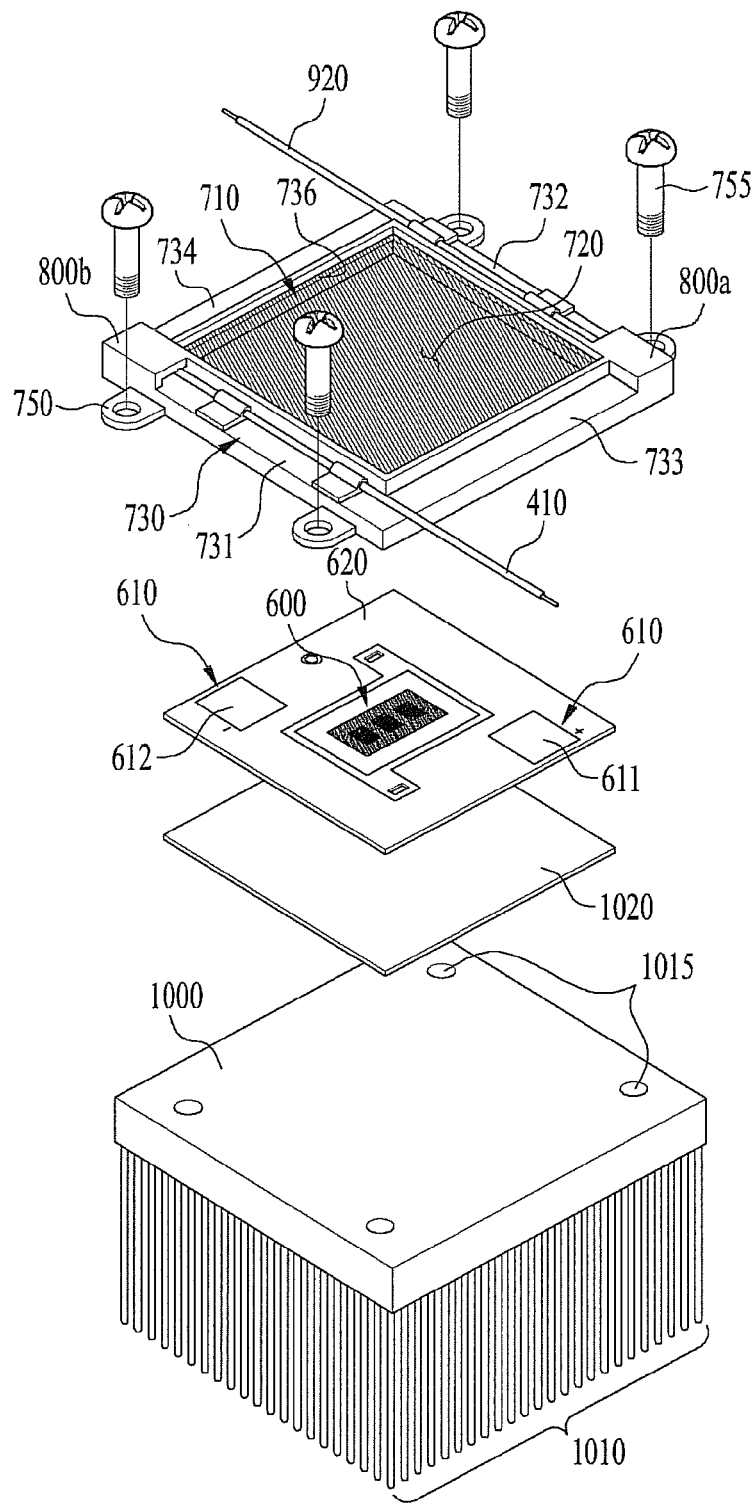
FIG. 31 is a view illustrating a light source module according to an eighteenth embodiment.

FIG. 31 is a view illustrating a light source module according to an eighteenth embodiment. Contents overlapped with the above described embodiment will not be described again.

The light source module according to the eighteenth embodiment includes the substrate 620, which includes the light source 600 disposed on the surface thereof, the holder 700, which is disposed on the substrate 620 and has the opening 710 corresponding to the light source 600, and the diffusion member 720, which is fastened to the opening 710 so as to be disposed on the light source 600. A heat radiating member 1000 is provided beneath the substrate 620.

The light source 600 includes a light emitting device, and may be a Chip On Board (COB) type in which the light emitting device in the form of a chip is mounted on a substrate.

The holder 700 may include the support plate 730, which is positioned to correspond to at least a partial edge region of the substrate 620, and the at least one cover unit 800 having a cavity corresponding to the electrode pad 610.

In FIG. 31, although the support plate 730 is illustrated as including the first support plate 731, which is disposed to correspond to one of four edge regions of the substrate 620, the second support plate 732, which is disposed to face the first support plate 731, the third support plate 733, which connects one end of the first support plate 731 and one end of the second support plate 732 to each other, and the fourth support plate 734, which is disposed to face the third support plate 733 and connects the other end of the first support plate 731 and the other end of the second support plate 732 to each other, the support plate 730 may include only two symmetrical support plates 731 and 732, or 733 and 734.

The inner circumferential surface of the opening 710, i.e. the inner surfaces of the first, second, third and fourth support plates 731 to 734 may be provided with the insertion grooves 736, and the diffusion member 720 may be inserted into and coupled in the insertion grooves 736.

The diffusion member 720 expands a light incidence angle to the maximum extent via refraction and scattering of light directed from the light source 600, to ensure uniform diffusion of light.

The heat radiating member 1000 serves to discharge heat generated from the light source 600 to the outside, and thus may be formed of a material having excellent thermal conductivity.

The heat radiating member 1000 may include a plurality of radiating fins 1010 extending downward from a lower surface thereof. The radiating fins 1010 increase a contact area between the heat radiating member 1000 and outside air, which may improve heat radiation effects.

A thermal conductive member 1020 may be disposed between the heat radiating member 1000 and the substrate 620. The thermal conductive member 1020 has excellent thermal conductivity, and electric insulation and flame-resistance properties, and serves to assist the heat radiating member 1000 in coming into close contact with a heating region, thereby maximizing heat transfer effects.

The support plate 730 may include one or more second fastening portions 750 protruding from the support plate 730.

The second fastening portions 750 may be extended on the same plane as the support plate 730, and may protrude beyond a width of the substrate 620 that is disposed beneath the holder 700.

The heat radiating member 1000 is provided with fastening portions 1015 at regions corresponding to the second fastening portions 750 of the support plate 730, such that the holder 700 may be fixed to the heating member 1000 by fasteners 755.

Although FIG. 31 illustrates the second fastening portions 750 as being formed in the first support plate 731 and the second support plate 732 by way of example, the disclosure is not limited thereto.

The second fastening portions 750 may be symmetrically formed at the two facing support plates 731 and 732, or 733 and 734, to ensure that the holder 700 may be more firmly fixed to the heat radiating member 1000.

Although the holder 700 may be fixedly coupled to the substrate 620 as described in the above embodiments, the substrate 620 may have difficulty in forming the fastening portions due to, e.g., the circuit pattern formed thereon. Therefore, when providing the holder 700 with the second fastening portions 750, the holder 700 may be fixed to the heat radiating member 1000 by the fasteners 755.

Alternatively, according to the embodiments, the holder 700 may be fixedly coupled to both the substrate 620 and the heat radiating member 1000.

As described above, the thermal conductive member 1020 may be disposed between the substrate 620 and the heat radiating member 1000, so as to fix the substrate 620 to the heat radiating member 1000. However, by fixing the holder 700 to the heat radiating member 1000 by the fasteners 755 in consideration of a high price of the thermal conductive member 1020, the substrate 620 may be fixed to the heat radiating member 1000 without the thermal conductive member 1020, which may reduce manufacturing costs of a light emitting module.

Figure 32:
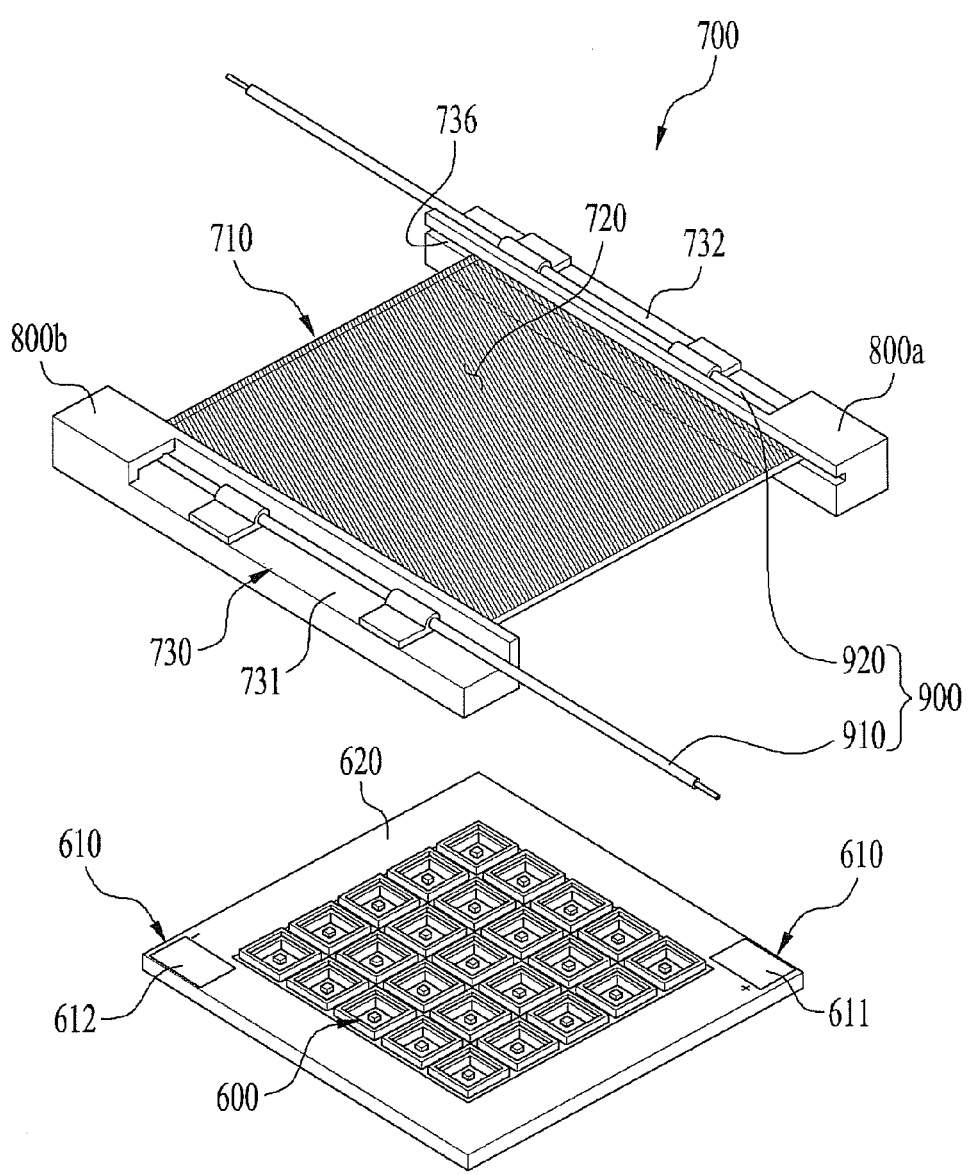
FIG. 32 is a view illustrating a light source module according to a nineteenth embodiment.
Figure 33:
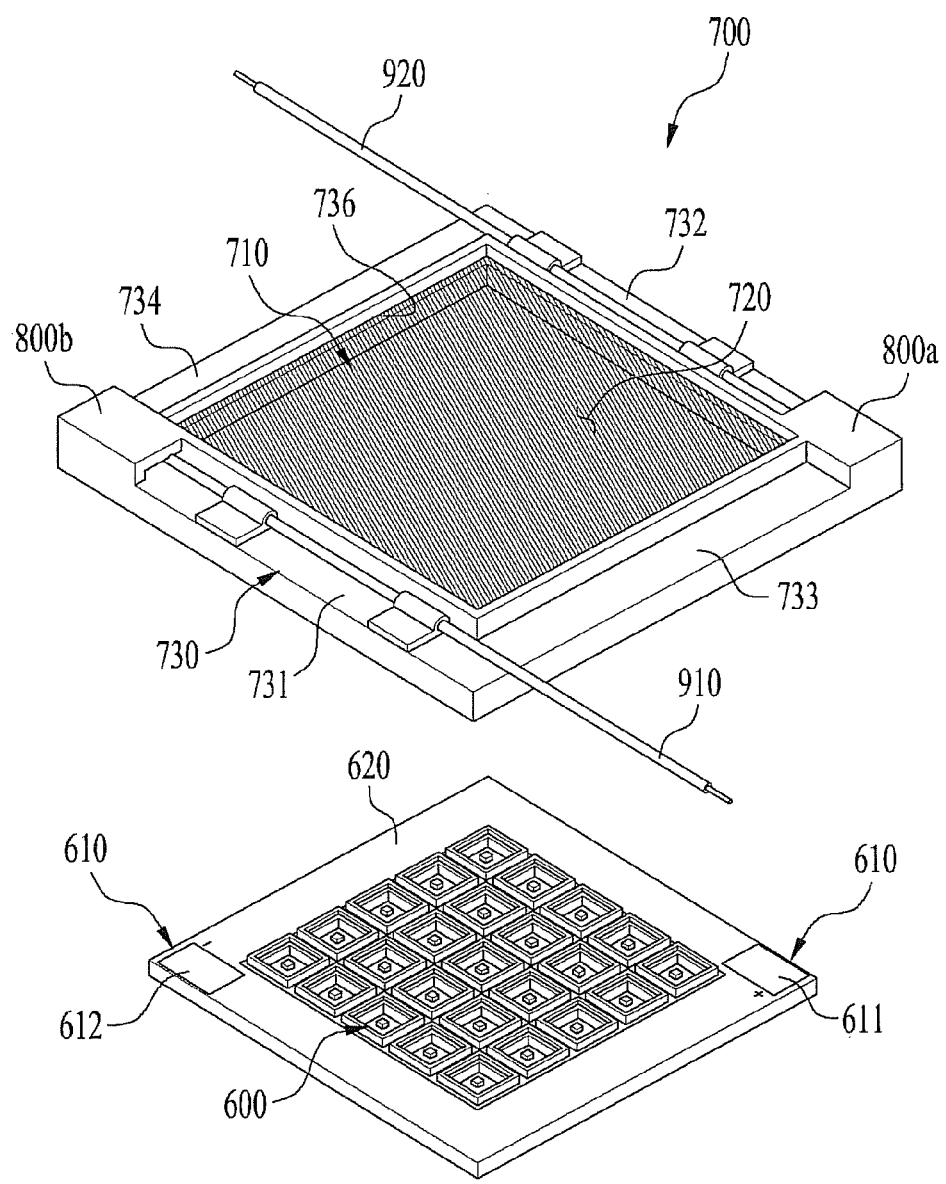
FIG. 33 is a view illustrating a light source module according to a twentieth embodiment.
Figure 34:
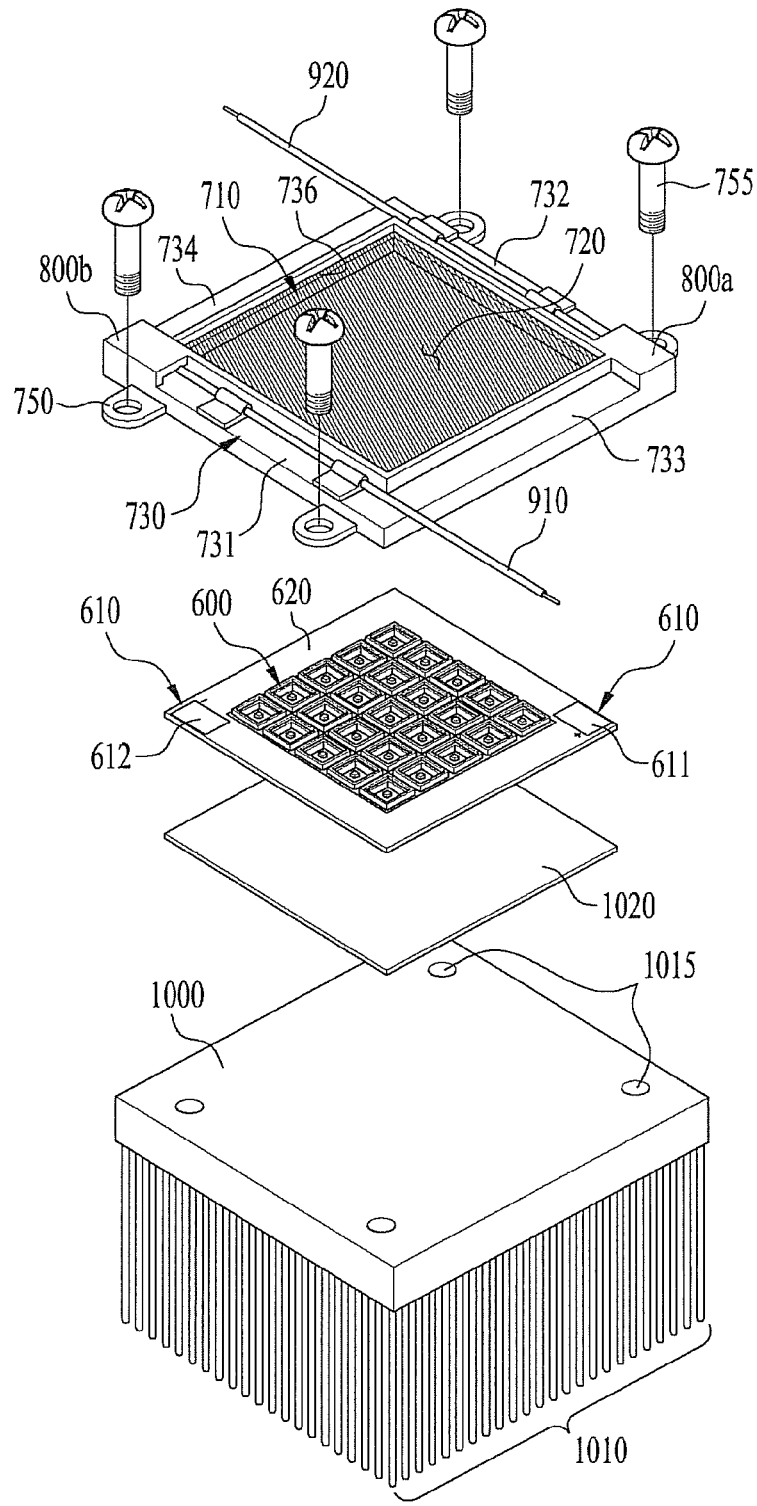
FIG. 34 is a view illustrating a light source module according to a twenty-first embodiment.

FIG. 32 is a view illustrating a light source module according to a nineteenth embodiment, and FIG. 33 is a view illustrating a light source module according to a twentieth embodiment. FIG. 34 illustrates a light source module according to a twenty-first embodiment. Contents overlapped with the above described embodiment will not be described again.

The light source modules according to the embodiments include the substrate 620, which includes the light source 600 disposed on the surface thereof and the electrode pad 610 electrically connected to the light source 600, the holder 700, which is disposed on the substrate 620 and has the opening 710 corresponding to the light source 600, and the diffusion member 720, which is fastened to the opening 710 so as to be disposed on the light source 600.

The light source 600 includes a light emitting device package, and may be a Package On Board (COB) type in which the light emitting device package is mounted on a substrate.

The holder 700 may include the support plate 730, which is positioned to correspond to at least a partial edge region of the substrate 620, and the at least one cover unit 800 having a cavity corresponding to the electrode pad 610.

The nineteenth, twentieth, and twenty-first embodiments are respectively similar to the sixteenth, seventeenth, and eighteenth embodiments except for the light source 600 including a light emitting device package, and thus, a detailed description thereof will be omitted.

Figure 35:
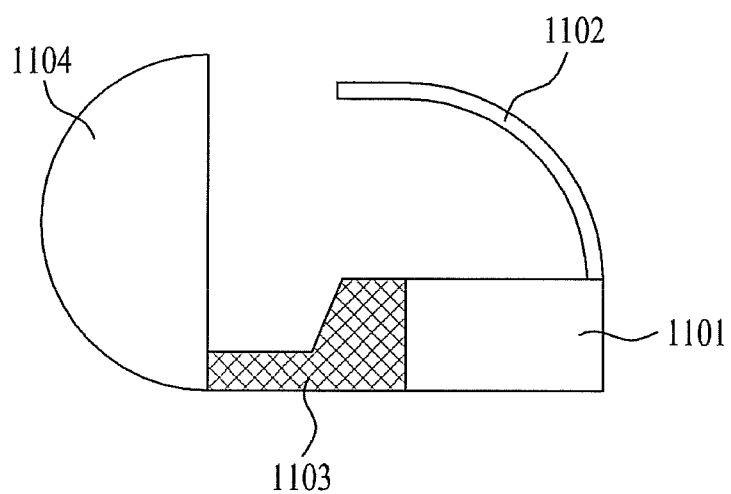
FIG. 35 is a view illustrating an embodiment of a head lamp including the light source module according to the above described embodiments.

FIG. 35 is a view illustrating an embodiment of a head lamp including the light source module according to the above described embodiments.

Referring to FIG. 35, light emitted from a light source module 1101 may be reflected by a reflector 1102 and a shade 1103, and thereafter, may be directed forward of a vehicle body through a lens 1104.

The light source module 1101 may be the light source module according to the above described embodiments, and may be a Chip On Board (COB) type in which a light emitting device is mounted on a substrate, or a Package On Board (POB) type in which a light emitting device package is mounted on a substrate.

As is apparent from the above description, according to the embodiments, a radiator included in a light emitting device package exhibits less thermal volumetric expansion, which may minimize thermal deformation during fabrication, achieve a balanced light emission angle, and improve reliability of the light emitting device package.

Further, direct conduction between a light emitting device and the radiator is possible, which may simplify fabrication of the light emitting device package.

The light emitting device package includes gold-plated electrodes, which have high oxidation-resistance and durability and reduced short-circuiting therebetween. As the gold-plated electrodes, which have a relatively low photoelectric reflectivity in a short wavelength band of UV light, are reduced in area, a ceramic layer, which has a relatively high UV photoelectric reflectivity, is increased in exposure area. This results in improved light extraction efficiency and stability of a structure owing to increased bonding force between the exposed ceramic substrate and silicon resin in a molded part.

Furthermore, a light source module and an external power source are mechanically connected to each other without soldering. In this way, an eco-friendly light source module may be obtained without a risk of environmental contamination. The resulting light source module may achieve improved reliability with a minimized wire connection failure.

In addition, a diffusion member is coupled to a holder without requiring a separate support member for the diffusion member, which may simplify the configuration of the light source module and minimize an attachment failure of the diffusion member.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a housing having a through-hole;
   a heat sink portion in the through-hole, wherein the heat sink portion includes an alloy layer; and
   a light emitting device on the heat sink portion.
2. The light emitting device package according to claim 1, wherein the light emitting device is directly disposed on the alloy layer.
3. The light emitting device package according to claim 1, wherein the alloy layer includes at least one of W, Cu or Mo.
4. The light emitting device package according to claim 1, wherein the heat sink portion comprises an alloy layer having CuW or CuMo and a copper layer under the alloy layer.
5. The light emitting device package according to claim 1, wherein the through-hole is formed in a bottom surface of the housing.
6. The light emitting device package according to claim 1, wherein the heat sink portion includes a first heat sink portion and a second heat sink portion.
7. The light emitting device package according to claim 6, wherein a portion of the housing is disposed between the first heat sink portion and the second heat sink portion.
8. The light emitting device package according to claim 1, wherein a width of the heat sink portion increases with increasing distance from the light emitting device.
9. The light emitting device package according to claim 1, wherein a width of the heat sink portion increases with decreasing distance from the light emitting device.
10. A light emitting device package comprising:
    a package body having a through-hole;
    a radiator disposed in the through-hole, wherein the radiator includes an alloy layer having Cu; and
    a light emitting device disposed on the radiator.
11. The light emitting device package according to claim 10, wherein the alloy layer includes at least one of W or Mo.
12. The light emitting device package according to claim 10, wherein the alloy layer comprises CuW or CuMo and a copper layer under the alloy layer.
13. The light emitting device package according to claim 10, wherein the package body includes at least one of $Si_xO_y$, $Si_xN_y$, $Al_2O_3$, or AlN.
14. The light emitting device package according to claim 10, wherein the radiator comprises a first radiator and a second radiator.
15. The light emitting device package according to claim 14, wherein a portion of the package body is disposed between the first radiator and the second radiator.
16. A light emitting device package comprising:
    a package body a through-hole;
    a radiator in the through-hole;
    an anti-bulging layer on the radiator; and
    a light emitting device on the anti-bulging layer.
17. The light emitting device package according to claim 16, wherein the anti-bulging layer comprises an electrode pattern electrically connected to the light emitting device.
18. The light emitting device package according to claim 16, wherein the radiator is exposed outside from a lower surface of the package body and,
    wherein the through-hole is formed in a bottom surface of the package body.
19. The light emitting device package according to claim 1, wherein the housing includes a cavity including a sidewall and a bottom surface, and wherein the through-hole is formed in the bottom surface of the cavity.
20. The light emitting device package according to claim 10, wherein the package body includes an anti-bulging layer disposed between the light emitting device and the radiator.

* * * * *